US012588573B2

(12) United States Patent
Sugiyama et al.

(10) Patent No.: US 12,588,573 B2
(45) Date of Patent: Mar. 24, 2026

(54) SEMICONDUCTOR DEVICE

(71) Applicants:Kabushiki Kaisha Toshiba, Tokyo
(JP); **Toshiba Electronic Devices &
Storage Corporation**, Tokyo (JP)

(72) Inventors: Toru Sugiyama, Tokyo (JP); **Akira
Yoshioka**, Yokohama Kanagawa (JP);
Hung Hung, Kawasaki Kanagawa (JP);
Yasuhiro Isobe, Tokyo (JP); **Hitoshi
Kobayashi**, Yamato Kanagawa (JP);
Tetsuya Ohno, Yokohama Kanagawa
(JP); Naonori Hosokawa, Yokohama
Kanagawa (JP); Masaaki Onomura,
Setagaya Tokyo (JP); Masaaki Iwai,
Yokohama Kanagawa (JP)

(73) Assignees: Kabushiki Kaisha Toshiba, Kawasaki
(JP); **Toshiba Electronic Devices &
Storage Corporation**, Kawasaki (JP)

( * ) Notice: Subject to any disclaimer, the term of this
patent is extended or adjusted under 35
U.S.C. 154(b) by 608 days.

(21) Appl. No.: 17/968,496

(22) Filed: Oct. 18, 2022

(65) Prior Publication Data

US 2023/0031562 A1     Feb. 2, 2023

Related U.S. Application Data

(63) Continuation of application No. 17/197,107, filed on
Mar. 10, 2021, now Pat. No. 11,508,647.

(30) Foreign Application Priority Data

Sep. 11, 2020     (JP) ................................. 2020-153000

(51) Int. Cl.
H01L 23/495     (2006.01)
H10D 1/47     (2025.01)
(Continued)

(52) U.S. Cl.
CPC .... H01L 23/49575 (2013.01); H01L 23/4952
(2013.01); H10D 1/47 (2025.01);
(Continued)

(58) Field of Classification Search
None
See application file for complete search history.

(56) References Cited

U.S. PATENT DOCUMENTS 9,048,837 B2      6/2015  Hirose et al.
10,163,811 B2    12/2018  Zhao
(Continued)

FOREIGN PATENT DOCUMENTS

CN          104347619 A      2/2015
CN          110890881 A      3/2020
(Continued)

*Primary Examiner* — Cassandra F Cox
(74) *Attorney, Agent, or Firm* — Knobbe, Martens, Olson
& Bear, LLP

(57)               ABSTRACT

A semiconductor device includes a semiconductor package
including an n-type channel normally-off transistor includ-
ing a first electrode, a second electrode, and a first control
electrode, a normally-on transistor including a third elec-
trode electrically connected to the second electrode, a fourth
electrode, and a second control electrode, a first diode
including a first anode electrically connected to the second
control electrode and a first cathode electrically connected to
the third electrode, and a Zener diode including a second
anode electrically connected to the first electrode and a
second cathode electrically connected to the second elec-
trode; a first terminal provided on the semiconductor pack-
age, the first terminal being electrically connected to the first
electrode; a plurality of second terminals provided on the
semiconductor package, the second terminals being electri-
cally connected to the first electrode, and the second termi-
nals being lined up in a first direction; a third terminal
provided on the semiconductor package, the third terminal (Continued)

being electrically connected to the fourth electrode; a plurality of fourth terminals provided on the semiconductor package, the fourth terminals being electrically connected to the first control electrode; and a plurality of fifth terminals provided on the semiconductor package, the fifth terminals being electrically connected to the second control electrode, and the fifth terminals being lined up in the first direction.

10 Claims, 23 Drawing Sheets

(51) Int. Cl.
  H10D 1/68       (2025.01)
  H10D 8/25       (2025.01)
  H10D 30/47      (2025.01)
(52) U.S. Cl.
  CPC ................. H10D 1/68 (2025.01); H10D 8/25 (2025.01); H10D 30/475 (2025.01)

(56)                  References Cited

U.S. PATENT DOCUMENTS

| | | | | |
|---|---|---|---|---|
| 11,508,647 B2 * | 11/2022 | Sugiyama | ......... | H01L 23/49575 |
| 11,658,236 B2 * | 5/2023 | Udrea | ................... | H10D 84/82 |
| | | | | 257/194 |

| | | | |
|---|---|---|---|
| 2005/0231990 A1 | 10/2005 | Uno et al. | |
| 2012/0087167 A1 | 4/2012 | Kuzumaki et al. | |
| 2012/0262220 A1 | 10/2012 | Springett | |
| 2015/0043116 A1 | 2/2015 | Weyers et al. | |
| 2016/0211246 A1 | 7/2016 | Akiyama et al. | |
| 2016/0247751 A1 | 8/2016 | Kinzer | |
| 2018/0013415 A1 | 1/2018 | Ikeda et al. | |
| 2020/0083882 A1 | 3/2020 | Eguchi et al. | |
| 2020/0126962 A1 | 4/2020 | Kono | |
| 2020/0220534 A1 | 7/2020 | Koyama et al. | |
| 2020/0366199 A1 | 11/2020 | Ikeda | |

FOREIGN PATENT DOCUMENTS

| | | |
|---|---|---|
| CN | 111415916 A | 7/2020 |
| JP | 2005-310907 A | 11/2005 |
| JP | 2011-010487 A | 1/2011 |
| JP | 2014-512765 A | 5/2014 |
| JP | 2014-229823 A | 12/2014 |
| JP | 2015-061265 A | 3/2015 |
| JP | 2015-228445 A | 12/2015 |
| JP | 2017-118099 A | 6/2017 |
| JP | 2019-029997 A | 2/2019 |
| WO | WO 2015/166523 A1 | 11/2015 |
| WO | 2017010554 A1 | 1/2017 |
| WO | WO 2019/065173 A1 | 4/2019 |

* cited by examiner

SEMICONDUCTOR DEVICE

CROSS-REFERENCE TO RELATED APPLICATION

This application is a continuation of U.S. application Ser. No. 17/197,107 filed on Mar. 10, 2021 and is based upon and claims the benefit of priority from Japanese Patent Application No. 2020-153000, filed on Sep. 11, 2020, the entire contents of which are incorporated herein by reference.

FIELD

Embodiments described herein relate generally to Semiconductor device.

BACKGROUND

Group III nitrides, for example, gallium nitride (GaN)-based semiconductors have been expected as materials for next-generation power semiconductor devices. The GaN-based semiconductor has a bandgap larger than a silicon (Si) semiconductor. Thus, the GaN-based semiconductor device can achieve a power semiconductor device including a smaller size and a higher withstand voltage than a Si (silicon) semiconductor device. Accordingly, a parasitic capacitance can be reduced, and thus, a high-speed drive power semiconductor device can be achieved.

A high electron mobility transistor (HEMT) structure using a two-dimensional electron gas (2DEG) as a carrier is generally applied in GaN-based transistors. A normal HEMT is a normally-on transistor conducted even though a voltage is not applied to a gate. There is a problem that it is difficult to achieve a normally-off transistor not conducted unless the voltage is applied to the gate in the GaN-based transistor.

In a power supply circuit and the like that handles a large power of hundreds of volt to 1000 V, a normally-off operation is required in terms of safety. Thus, a circuit configuration that achieves the normally-off operation by performing a cascode connection in which a normally-on GaN-based transistor and a normally-off Si transistor are connected has been proposed.

In the case of a circuit configuration in which a main circuit current flowing between a drain and a source and a drive current flowing between a gate and the source share a source inductance, the drive current is also modulated due to an electromotive force caused in the source inductance with a temporal change of the main circuit current. There are problems such as delays such as decreases in a rising speed and a falling speed of a power semiconductor device and ringing in which a drain current and a source voltage change drastically with time. Accordingly, a circuit configuration using a Kelvin connection in which a main circuit current and a gate drive current do not share a source inductance has been proposed.

DETAILED DESCRIPTION

Figure 1:
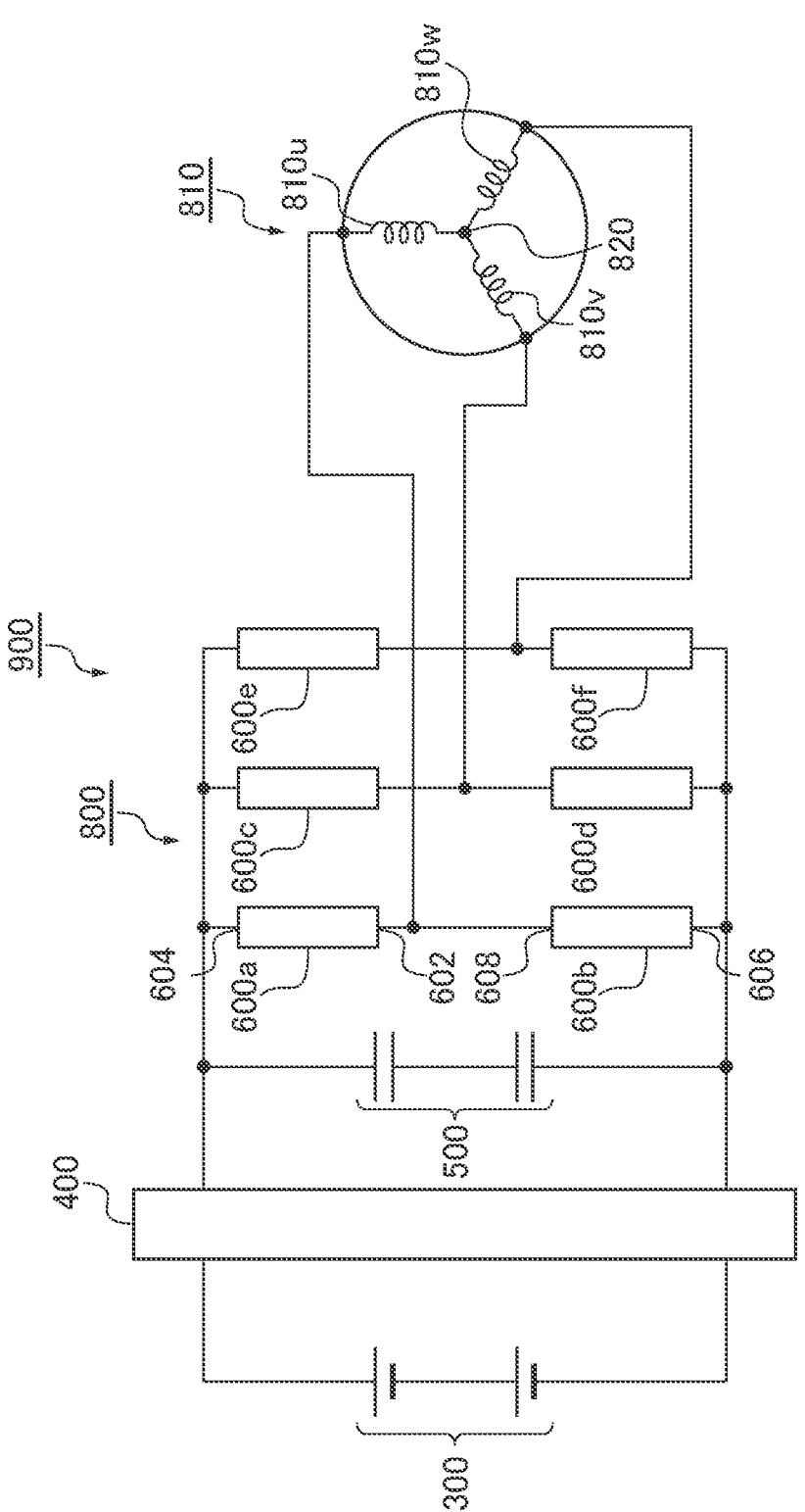
FIG. 1 is a schematic diagram of a power conversion system of a first embodiment.

Hereinafter, embodiments of the present disclosure will be described with reference to the drawings. In the following description, the same or similar members may be designated by the same reference numerals. The description of the members and the like described once may be omitted as appropriate.

In the present specification, a semiconductor device is a concept that includes a plurality of elements such as a power module in which a discrete semiconductor is combined, an intelligent power module in which a drive circuit that drives a plurality of elements such as a discrete semiconductor and a self-protection function are combined with the plurality of elements, or the entire system including the power module or the intelligent power module.

In the present specification, "GaN-based semiconductors" are a general term for semiconductors including gallium nitride (GaN), aluminum nitride (AlN), indium nitride (InN), and intermediate compositions thereof.

First Embodiment

A semiconductor device of an embodiment includes a semiconductor package including an n-type channel normally-off transistor including a first electrode, a second electrode, and a first control electrode, a normally-on transistor including a third electrode electrically connected to the second electrode, a fourth electrode, and a second control electrode, a first diode including a first anode electrically connected to the second control electrode and a first cathode electrically connected to the third electrode, and a Zener diode including a second anode electrically connected to the first electrode and a second cathode electrically connected to the second electrode; a first terminal provided on the semiconductor package, the first terminal being electrically connected to the first electrode; a plurality of second terminals provided on the semiconductor package, the second terminals being electrically connected to the first electrode, and the second terminals being lined up in a first direction; a third terminal provided on the semiconductor package, the third terminal being electrically connected to the fourth electrode; a plurality of fourth terminals provided on the semiconductor package, the fourth terminals being electrically connected to the first control electrode; and a plurality of fifth terminals provided on the semiconductor package, the fifth terminals being electrically connected to the second control electrode, and the fifth terminals being lined up in the first direction.

FIG. 1 is a schematic diagram of a power conversion system 900 of the present embodiment.

The power conversion system 900 includes a power conversion apparatus 800 and a motor 810.

The power conversion apparatus 800 includes transistors 600a, 600b, 600c, 600d, 600e, and 600f, a DC power supply 300, a converter 400, and a smoothing capacitor 500. As will be described later, the transistors 600a, 600b, 600c, 600d, 600e, and 600f may include a plurality of transistors and other elements.

The DC power supply 300 outputs a DC voltage. The converter 400 is a DC-DC converter, and converts the DC voltage output by the DC power supply 300 into another DC voltage. The smoothing capacitor 500 smooths the voltage output by the converter 400.

Each of the transistors 600a, 600b, 600c, 600d, 600e, and 600f includes a semiconductor device 100 to be described later. The transistors 600a, 600b, 600c, 600d, 600e, and 600f convert the DC voltage smoothed by the smoothing capacitor 500 to an AC voltage.

For example, the transistor 600a includes a first transistor electrode 602 and a second transistor electrode 604. The transistor 600b includes a third transistor electrode 606 and a fourth transistor electrode 608. The first transistor electrode 602 and the fourth transistor electrode 608 are electrically connected, and thus, the transistor 600a and the transistor 600b are electrically connected to each other.

Similarly, the transistor 600c and the transistor 600d are electrically connected to each other, and the transistor 600e and the transistor 600f are electrically connected to each other.

The motor 810 includes coils 810u, 810v, and 810w. One ends of the coils 810u, 810w, and 810v are electrically connected to each other at a neutral point 820. The other end of the coil 810u is electrically connected between the transistor 600a and the transistor 600b. The other end of the coil 810v is electrically connected between the transistor 600c and the transistor 600d. The other end of the coil 810w is electrically connected between the transistor 600e and the transistor 600f.

A ground in the power conversion apparatus 800 of the present embodiment may be electrically connected between, for example, a plurality of smoothing capacitors 500. For example, the ground in the power conversion apparatus 800 may be electrically connected to an electric wire at which the transistor 600b, the transistor 600d, and the transistor 600f are electrically connected to each other.

Figure 2:
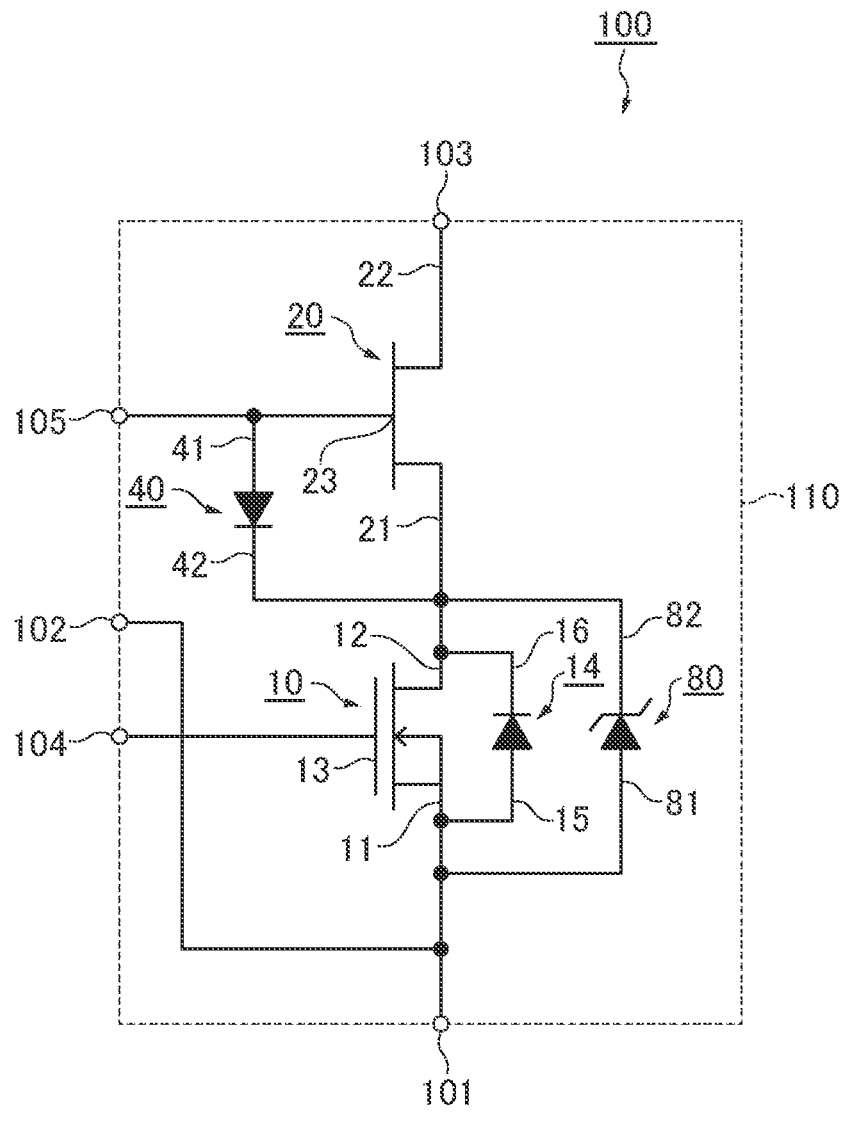
FIG. 2 is a circuit diagram of a semiconductor device of the first embodiment.

FIG. 2 is a circuit diagram of the semiconductor device 100 of the present embodiment. The semiconductor device 100 of the present embodiment is, for example, a power module including a rated voltage of 600 V or 1200 V.

The semiconductor device 100 includes an n-type normally-off transistor 10, a normally-on transistor 20, a first diode 40, a Zener diode 80, a first terminal 101, a second terminal 102, a third terminal 103, a fourth terminal 104, a fifth terminal 105, and a semiconductor package 110.

The n-type normally-off transistor 10 includes a first electrode 11, a second electrode 12, and a first control electrode 13.

The n-type normally-off transistor 10 is a transistor through which a drain current does not flow when a voltage is not input to a gate. The n-type normally-off transistor 10 is, for example, an n-type metal oxide semiconductor field effect transistor (MOSFET) using a silicon (Si) semiconductor. For example, the first electrode 11 is a source electrode, the second electrode 12 is a drain electrode, and the first control electrode 13 is a gate electrode. The n-type normally-off transistor 10 includes a body diode (parasitic diode) 14 including an anode 15 and a cathode 16. A withstand voltage of the n-type normally-off transistor 10 is, for example, 10 V or more and 50 V or less.

The normally-on transistor 20 includes a third electrode 21, a fourth electrode 22, and a second control electrode 23. The third electrode 21 is electrically connected to the second electrode 12.

The normally-on transistor 20 is a transistor through which a drain current flows even when a voltage is not input to a gate. The normally-on transistor 20 is, for example, a high electron mobility transistor (HEMT) using a GaN-based semiconductor. For example, the third electrode 21 is a source electrode, the fourth electrode 22 is a drain electrode, and the second control electrode 23 is a gate electrode.

A withstand voltage of the normally-on transistor 20 is larger than the withstand voltage of the n-type normally-off transistor 10. The withstand voltage of the normally-on transistor 20 is, for example, 40 V or more and 3500 V or less.

The semiconductor device 100 of the present embodiment achieves a normally-off operation by electrically connecting the n-type normally-off transistor 10 and the normally-on transistor 20 in series. For example, when the semiconductor device 100 is used for the transistor 600b (FIG. 1), the third transistor electrode 606 is electrically connected to the first electrode 11 and the fourth transistor electrode 608 is electrically connected to the fourth electrode 22.

The first diode 40 includes a first anode 41 and a first cathode 42. The first anode 41 is electrically connected to the second control electrode 23. The first cathode 42 is electrically connected to the third electrode 21. It is preferable that the first diode 40 is a Schottky barrier diode including a high response speed. The first diode 40 can be preferably used even though the first diode is a PN junction diode. The use of the first diode 40 will be described in a seventh usage aspect of the semiconductor device 100 of the embodiment which will be described later.

The Zener diode 80 includes a second anode 81 and a second cathode 82. The second anode 81 is electrically connected to the first electrode 11. The second cathode 82 is electrically connected to the second electrode 12. In other words, the Zener diode 80 is connected in parallel with the n-type normally-off transistor 10. When an overvoltage occurs at a connection portion between the n-type normally-off transistor 10 and the normally-on transistor 20 due to a surge or the like, a charge is released to the Zener diode 80 at a point in time when the overvoltage reaches a Zener voltage. Thus, a voltage rise at the connection portion is suppressed, and an increase in a leakage current of a gate insulating film of the normally-on transistor 20 and destruction of the gate insulating film are suppressed.

The n-type normally-off transistor 10, the normally-on transistor 20, the first diode 40, and the Zener diode 80 are provided in the semiconductor package 110. In other words, the semiconductor package 110 includes the n-type normally-off transistor 10, the normally-on transistor 20, the first diode 40, and the Zener diode 80.

The first terminal 101 is provided on the semiconductor package 110 and is electrically connected to the first electrode 11. The first terminal 101 is used, for example, as a source terminal of the semiconductor device 100.

The second terminal 102 is provided on the semiconductor package 110 and is electrically connected to the first electrode 11. The second terminal 102 is used, for example, as a terminal for performing a Kelvin connection to the semiconductor device 100.

The third terminal 103 is provided on the semiconductor package 110 and is electrically connected to the fourth electrode 22. The third terminal 103 is used, for example, as a drain terminal of the semiconductor device 100.

The fourth terminal 104 is provided on the semiconductor package 110 and is electrically connected to the first control electrode 13. The fourth terminal 104 is used, for example, to input a gate signal to the n-type normally-off transistor 10.

The fifth terminal 105 is provided on the semiconductor package 110 and is electrically connected to the second control electrode 23. The fifth terminal 105 is used, for example, to input a gate signal to the normally-on transistor 20.

Figures 3A, 3B:
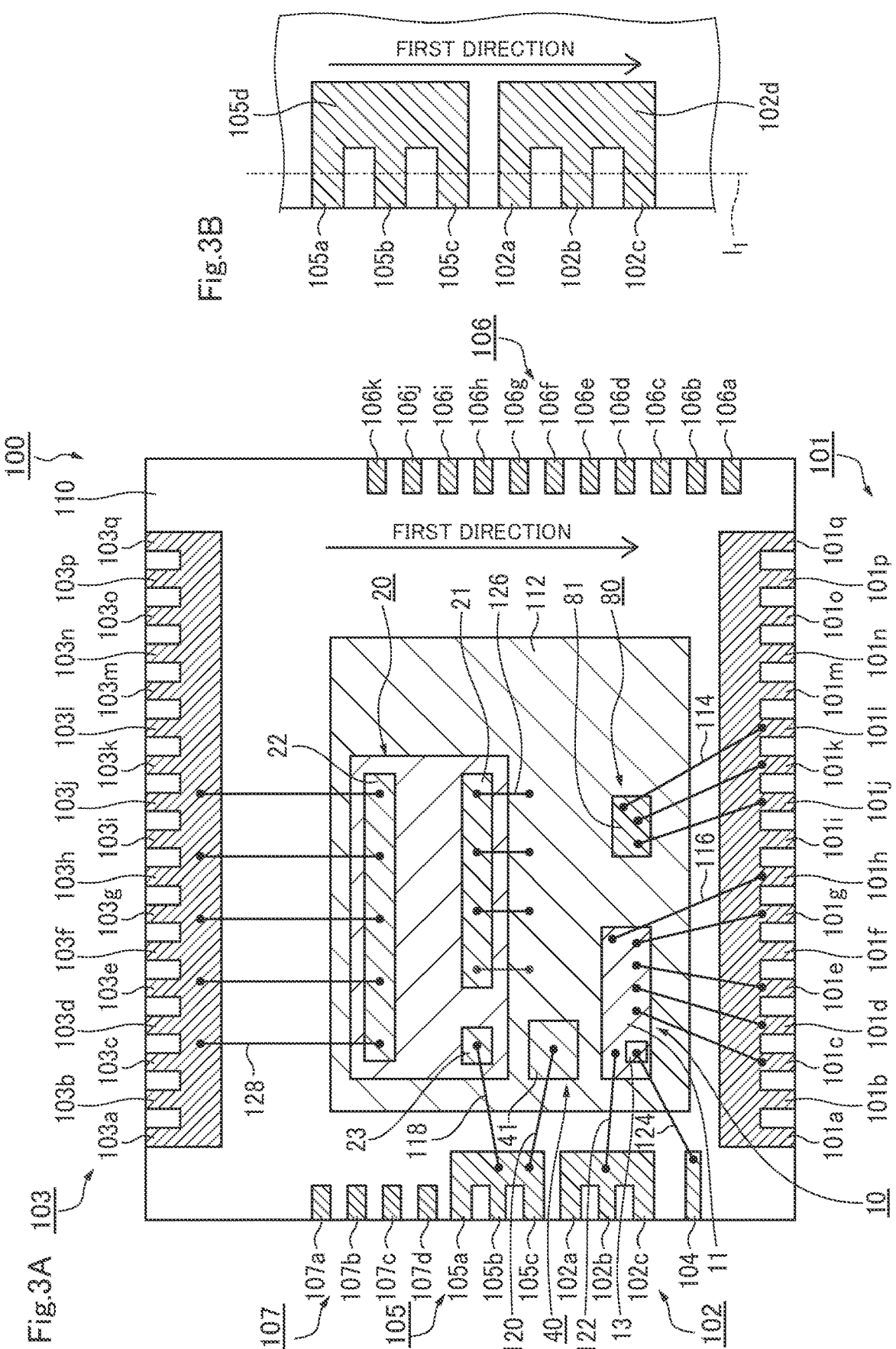
FIGS. 3A and 3B are schematic top views of the semiconductor device of the first embodiment.

FIGS. 3A and 3B are schematic top views of the semiconductor device 100 of the present embodiment.

FIG. 3A is a schematic top view of the semiconductor device 100 of the present embodiment. FIG. 3B is an example of a part of the schematic top view of the semiconductor device 100 of the present embodiment.

The n-type normally-off transistor 10 is, for example, a vertical Si-MOSFET, and the first electrode 11 and the first control electrode 13 are provided on an upper surface thereof. The first electrode 11 is electrically connected to the first terminal 101 via, for example, a bonding wire 116. The first electrode 11 is electrically connected to the second terminal 102 via, for example, a bonding wire 122. The second electrode 12 is provided on a lower surface of the n-type normally-off transistor 10 (not shown). The second electrode 12 is electrically connected to, for example, a metal plate 112 plated with nickel, palladium, gold, or the like on copper (Cu). The first control electrode 13 is electrically connected to the fourth terminal 104 via a bonding wire 124.

The second anode 81 of the Zener diode 80 is provided on an upper surface of the Zener diode 80. The second anode 81 is electrically connected to the first terminal 101 via, for example, a bonding wire 114. That is, the second anode 81 is electrically connected to the first electrode 11 via, for example, the bonding wire 114, the first terminal 101, and the bonding wire 116. The second cathode 82 is provided on a lower surface of the Zener diode 80 (not shown). The second cathode 82 is, for example, electrically connected to the plate 112. The second cathode 82 is electrically connected to the second electrode 12 via, for example, the plate 112.

The third electrode 21, the fourth electrode 22, and the second control electrode 23 of the normally-on transistor 20 are provided on an upper surface of the normally-on transistor 20. The third electrode 21 is connected to the plate 112 via, for example, a bonding wire 126. That is, the third electrode 21 is electrically connected to the second electrode 12 via, for example, the bonding wire 126 and the plate 112. The fourth electrode 22 is electrically connected to the third terminal 103 via, for example, a bonding wire 128. The second control electrode 23 is electrically connected to the fifth terminal 105 via, for example, a bonding wire 118.

The first anode 41 of the first diode 40 is provided on an upper surface of the first diode 40. The first anode 41 is electrically connected to the fifth terminal 105, for example, via a bonding wire 120. That is, the first anode 41 is electrically connected to the second control electrode 23 via the bonding wire 120, the fifth terminal 105, and the bonding wire 118. The first cathode 42 is provided on a lower surface of the first diode 40 (not shown). The first cathode 42 is electrically connected to the third electrode 21 via the plate 112 and the bonding wire 126.

Figure 21:
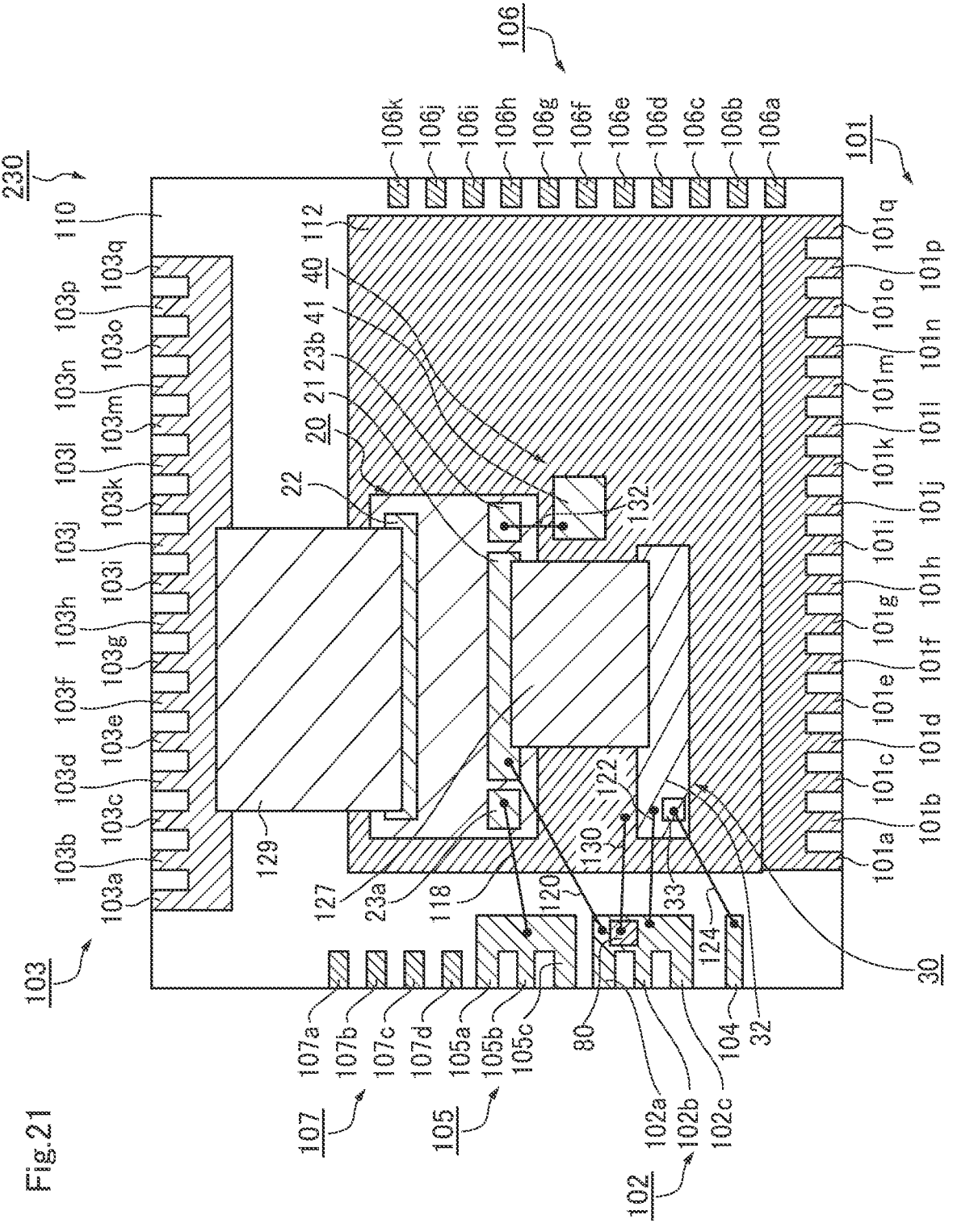
FIG. 21 is a schematic top view of a semiconductor device of a fifth embodiment.

The material and the number of bonding wires used in the semiconductor device 100 of the present embodiment are not particularly limited. The connection between the components is not limited to the bonding wire, and may be connection using a metal plate as shown in FIG. 21.

The semiconductor device 100 includes a plurality of second terminals 102a, 102b, and 102c as the second terminal 102. The plurality of second terminals 102a, 102b, and 102c is electrically connected to each other by a terminal 102d.

The semiconductor device 100 includes a plurality of fifth terminals 105a, 105b, and 105c as the fifth terminal. The fifth terminals 105a, 105b, and 105c are electrically connected to each other by a terminal 105d.

Similarly, the semiconductor device 100 includes a plurality of first terminals 101a, 101b, 101c, . . . , and 101q electrically connected to each other as the first terminal 101. The first terminals 101a, 101b, 101c, . . . , and 101q may not be separated. The semiconductor device 100 includes a plurality of third terminals 103a, 103b, 103c, . . . , and 103q electrically connected to each other as the third terminal 103. The semiconductor device 100 may further include terminals 106a, 106b, 106c, . . . , and 106k and terminals 107a, 107b, 107c, and 107d as a terminal 106 and a terminal 107 which are other terminals, respectively.

Figure 20:
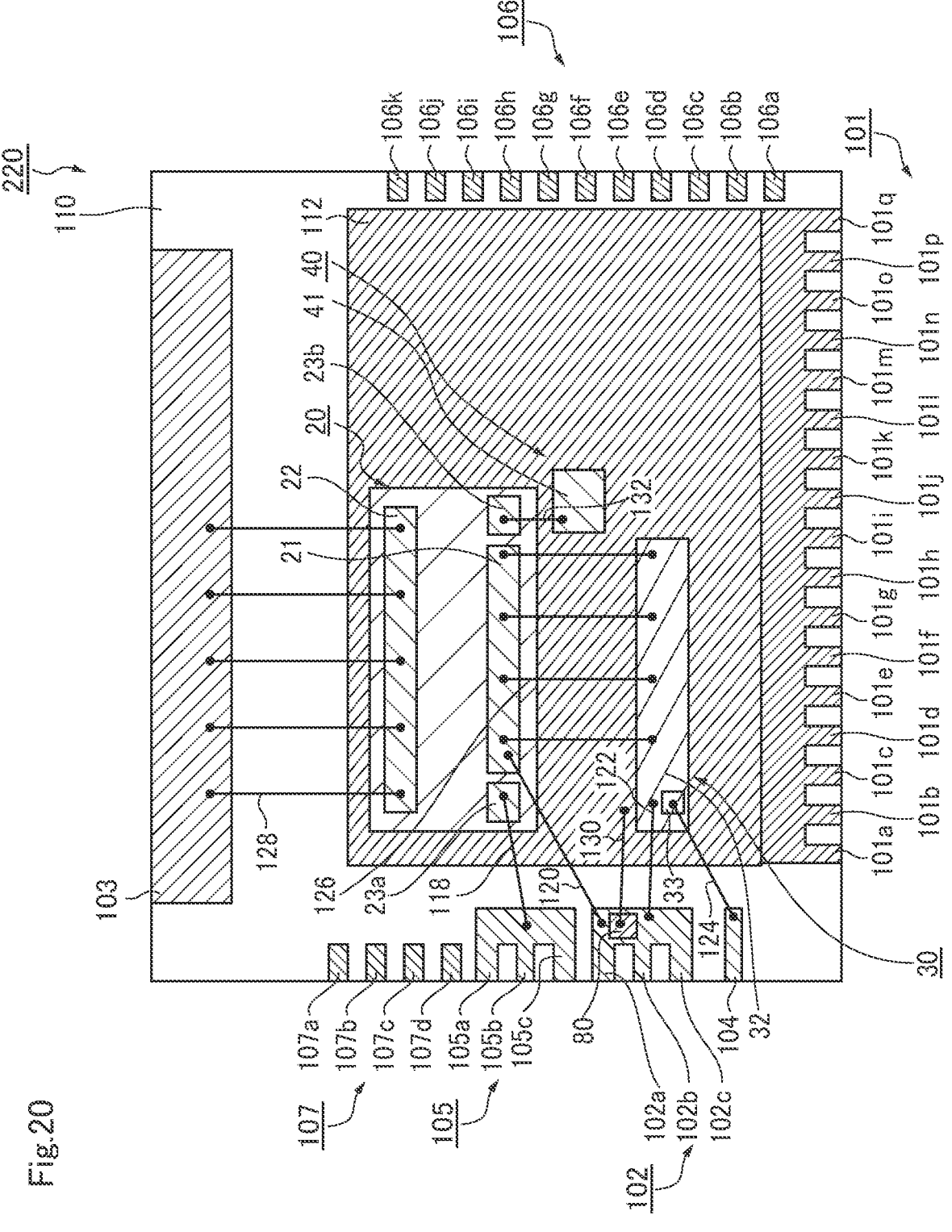
FIG. 20 is a schematic top view of a semiconductor device of a fourth embodiment.

The third terminals 103a, 103b, 103c, . . . , and 103q may not be separated as shown in FIG. 20. The same applies to the second terminal 102, the fifth terminal 105, the first terminal 101, the terminal 106, and the terminal 107.

For example, as shown in FIG. 3B, a virtual straight line $l_1$ passes through the plurality of second terminals 102a, 102b, and 102c. The virtual straight line $l_1$ passes through the plurality of fifth terminals 105a, 105b, and 105c. In other words, the plurality of second terminals 102a, 102b, and 102c is lined up in a first direction. The plurality of fifth terminals 105a, 105b, and 105c is lined up in the first direction. Here, the first direction is, for example, a direction in which the first terminal 101 and the third terminal 103 face each other.

The virtual straight line $l_1$ is not actually described or provided in the semiconductor device 100.

It is preferable that the plurality of second terminals 102a, 102b, and 102c and the plurality of fifth terminals 105a, 105b, and 105c are provided at an end portion of the semiconductor package 110.

It is preferable that neither the first terminal 101, the third terminal 103, nor the fourth terminal 104 is provided between the plurality of second terminals 102a, 102b, and 102c and the plurality of fifth terminals 105a, 105b, and 105c. In other words, it is preferable that the plurality of second terminals 102a, 102b, and 102c and the plurality of fifth terminals 105a, 105b, and 105c are adjacent to each other without passing through any of the first terminal 101, the third terminal 103, and the fourth terminal 104.

It is preferable that the fourth terminal 104 is provided at the end portion of the semiconductor package 110.

It is preferable that neither the first terminal 101, the third terminal 103, nor the fifth terminal 105 is provided between the plurality of second terminals 102a, 102b, and 102c and the fourth terminal 104. In other words, it is preferable that the plurality of second terminals 102a, 102b, and 102c and the fourth terminal 104 are provided adjacent to each other without passing through any of the first terminal 101, the third terminal 103, and the fifth terminal 105.

The number of the plurality of second terminals 102a, 102b, and 102c is three in the semiconductor device 100 of the present embodiment, but is not limited to three. The number of the plurality of fifth terminals 105a, 105b, and 105c is three in the semiconductor device 100 of the present embodiment, but is not limited to three.

Figure 4:
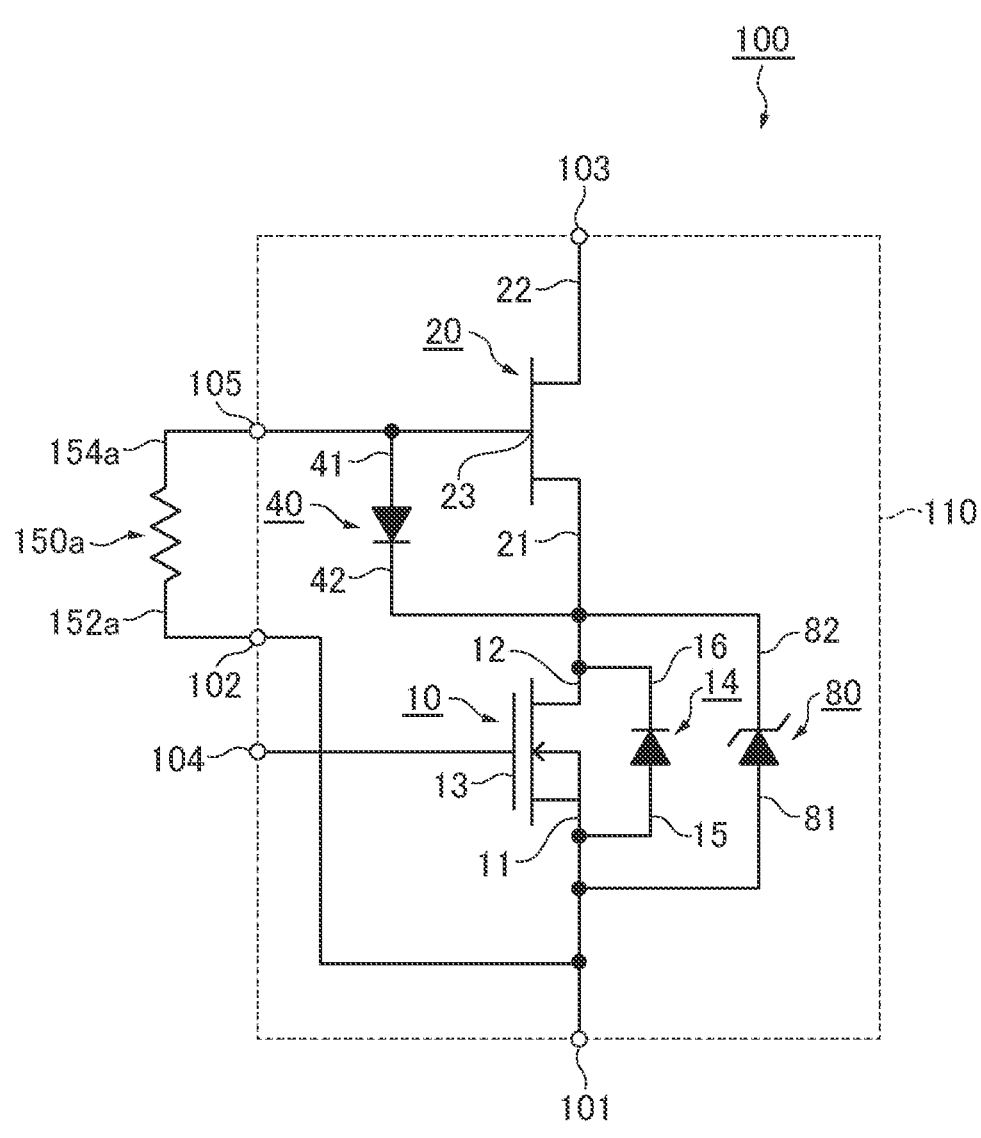
FIG. 4 is a circuit diagram showing a first usage aspect of the semiconductor device of the first embodiment.

FIG. 4 is a circuit diagram showing a first usage aspect of the semiconductor device 100 of the present embodiment. A chip resistor 150a as a chip resistor 150 includes a sixth terminal 152a as a sixth terminal 152 and a seventh terminal 154a as a seventh terminal 154. The sixth terminal 152a is electrically connected to the second terminal 102, and the seventh terminal 154a is electrically connected to the fifth terminal 105. The chip resistor 150a is, for example, a 0603 type chip resistor including a long side of 0.6 mm and a short side of 0.3 mm.

Figure 5:
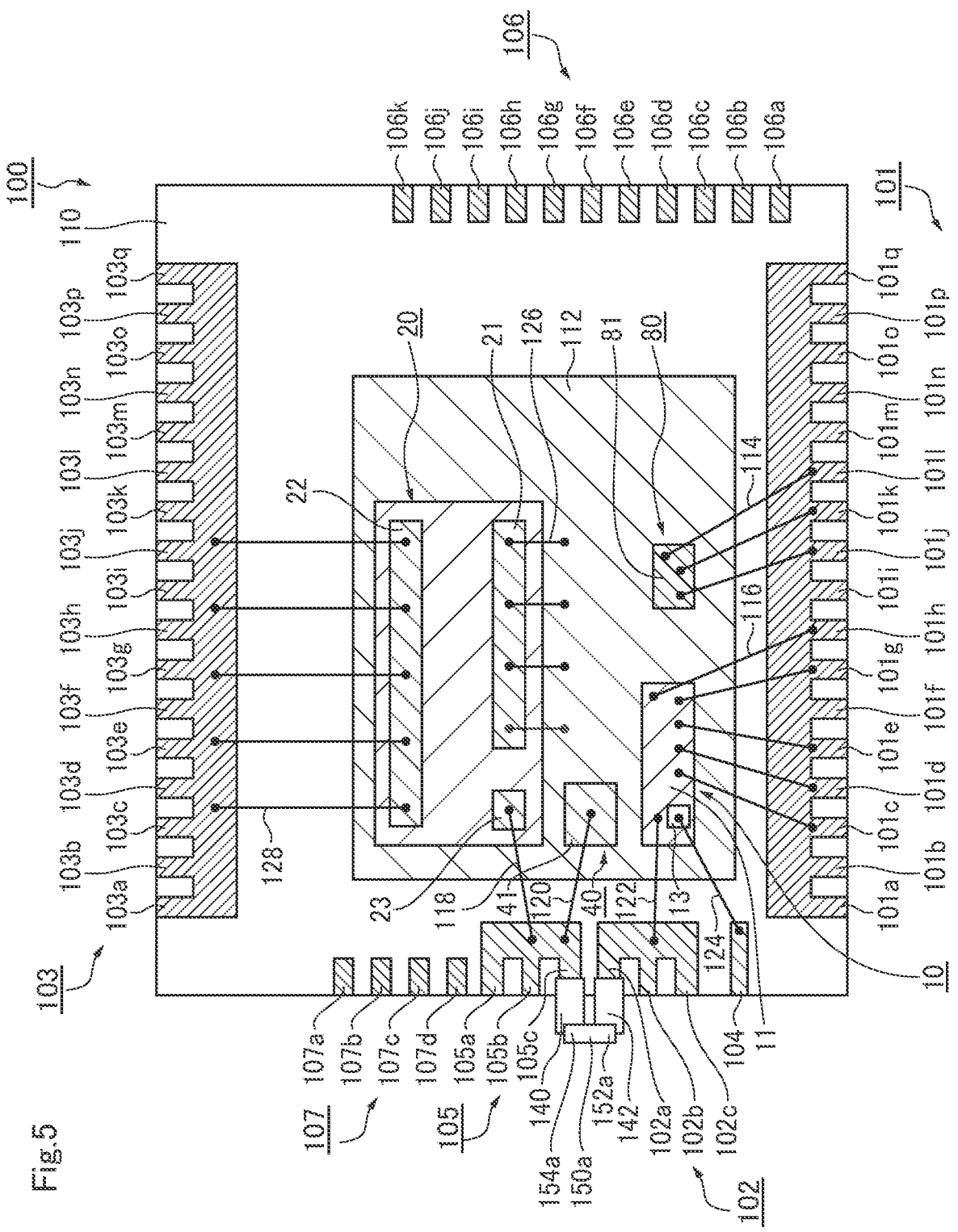
FIG. 5 is a schematic top view showing the first usage aspect of the semiconductor device of the first embodiment.

FIG. 5 is a schematic top view showing the first usage aspect of the semiconductor device 100 of the present embodiment. The sixth terminal 152a is electrically connected to the second terminal 102a as the second terminal 102 via a metal plate 142. The seventh terminal 154a is electrically connected to the fifth terminal 105c via a metal plate 140.

Figure 6:
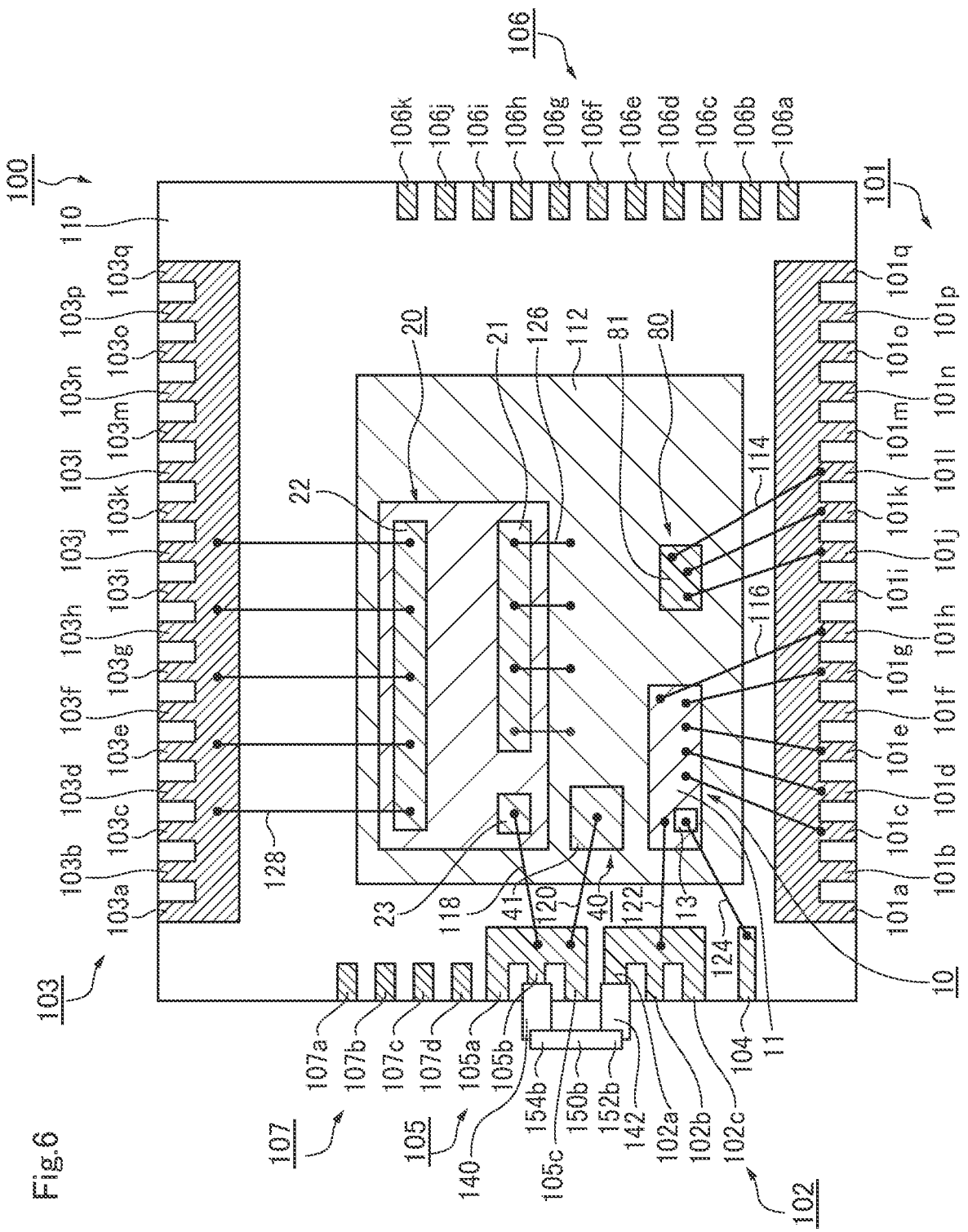
FIG. 6 is a schematic top view showing a second usage aspect of the semiconductor device of the first embodiment.

FIG. 6 is a schematic top view showing a second usage aspect of the semiconductor device 100 of the present embodiment. A chip resistor 150b as a chip resistor 150 includes a sixth terminal 152b as a sixth terminal 152 and a seventh terminal 154b as a seventh terminal 154. The sixth terminal 152b is electrically connected to the second terminal 102a as the second terminal 102, and the seventh terminal 154b is electrically connected to the fifth terminal 105b as the fifth terminal 105. The chip resistor 150b is, for example, a 1005 type chip resistor including a long side of 1.0 mm and a short side of 0.5 mm.

Figure 7:
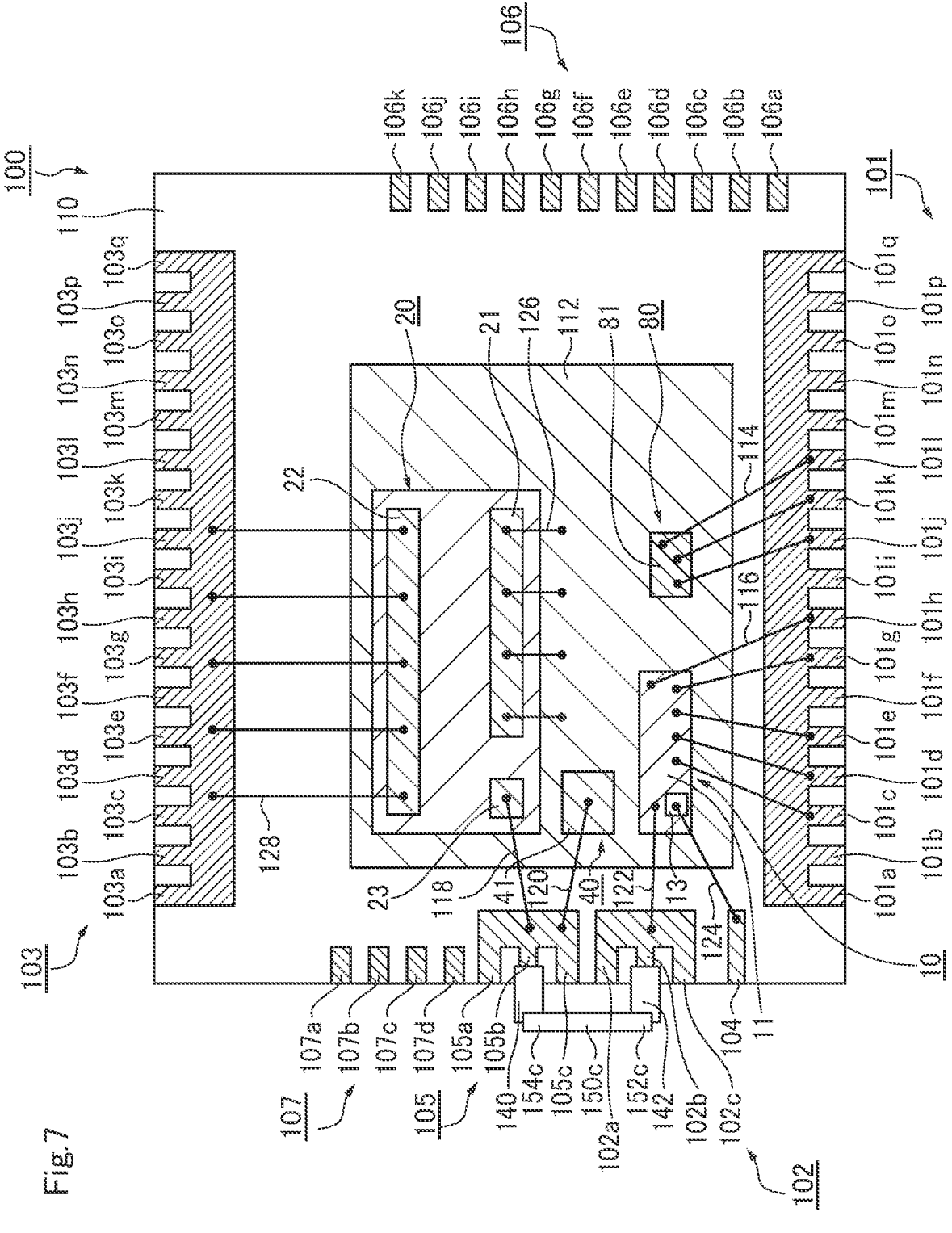
FIG. 7 is a schematic top view showing a third usage aspect of the semiconductor device of the first embodiment.

FIG. 7 is a schematic top view showing a third usage aspect of the semiconductor device 100 of the present embodiment. A chip resistor 150c as a chip resistor 150 includes a sixth terminal 152c as a sixth terminal 152 and a seventh terminal 154c as a seventh terminal 154. The sixth terminal 152c is electrically connected to the second terminal 102b as the second terminal 102, and the seventh terminal 154c is electrically connected to the fifth terminal 105b as the fifth terminal 105. The chip resistor 150c is, for example, a 1608 type chip resistor including a long side of 1.6 mm and a short side of 0.8 mm.

Figure 8:
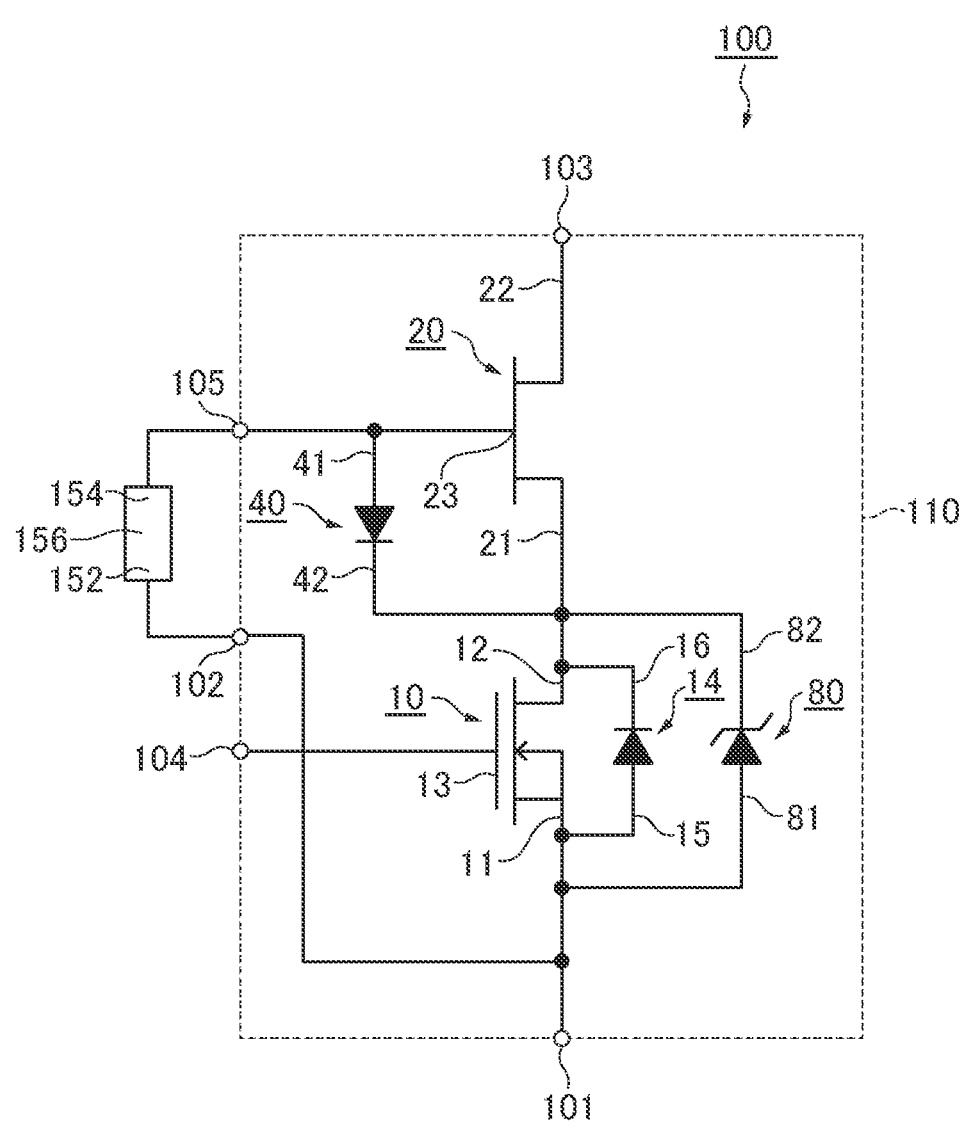
FIG. 8 is a circuit diagram showing a fourth usage aspect of the semiconductor device of the first embodiment.

FIG. 8 is a circuit diagram showing a fourth usage aspect of the semiconductor device 100 of the present embodiment. A chip ferrite bead 156 includes the sixth terminal 152 and the seventh terminal 154. The sixth terminal 152 is electrically connected to the second terminal 102, and the seventh terminal 154 is electrically connected to the fifth terminal 105.

Figure 9:
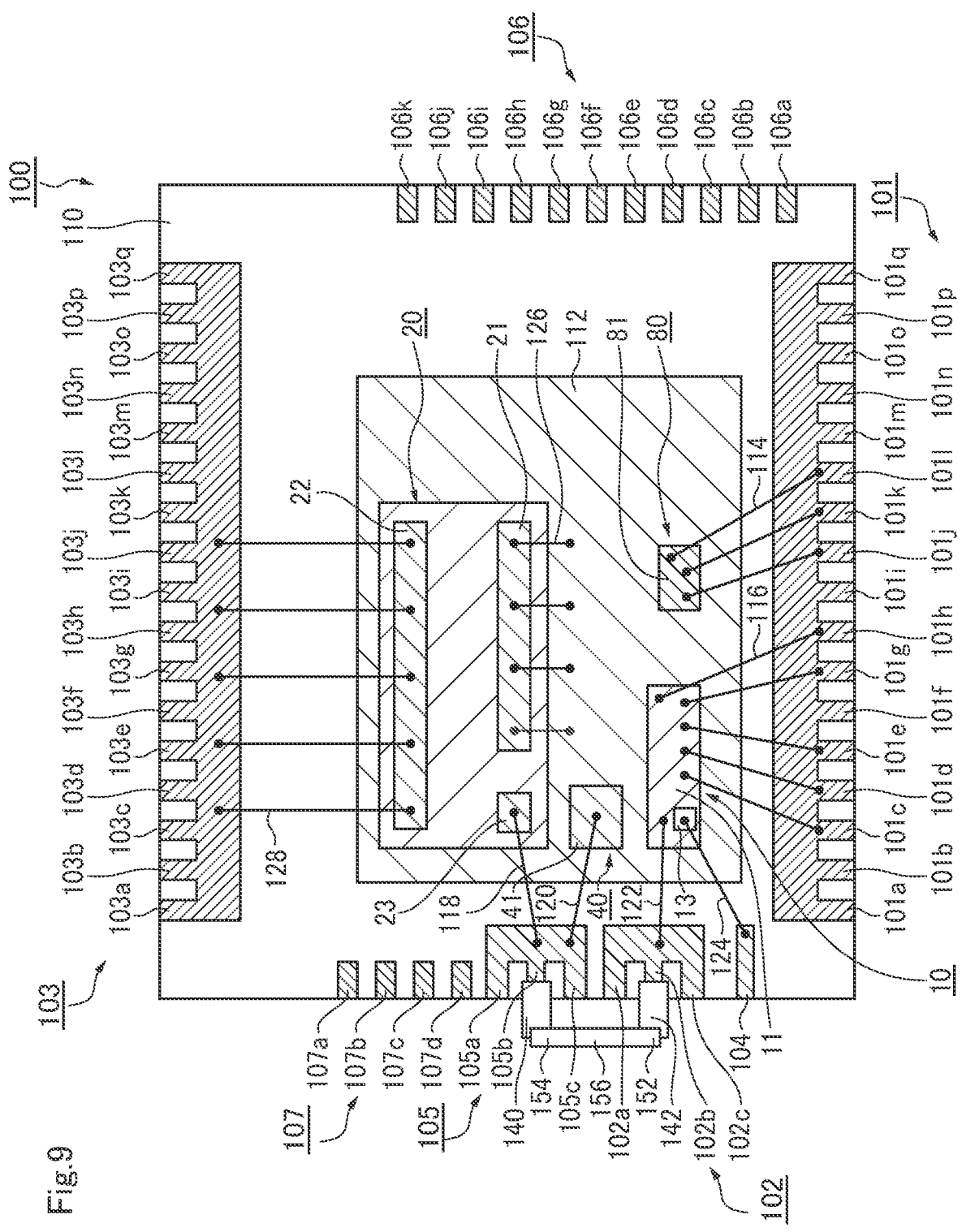
FIG. 9 is a schematic top view showing the fourth usage aspect of the semiconductor device of the first embodiment.

FIG. 9 is a schematic top view showing a fourth usage aspect of the semiconductor device 100 of the present embodiment. The sixth terminal 152 is electrically connected to the second terminal 102b as the second terminal 102 via the metal plate 142. The seventh terminal 154 is electrically connected to the fifth terminal 105b as the fifth terminal 105 via the metal plate 140.

Figure 10:
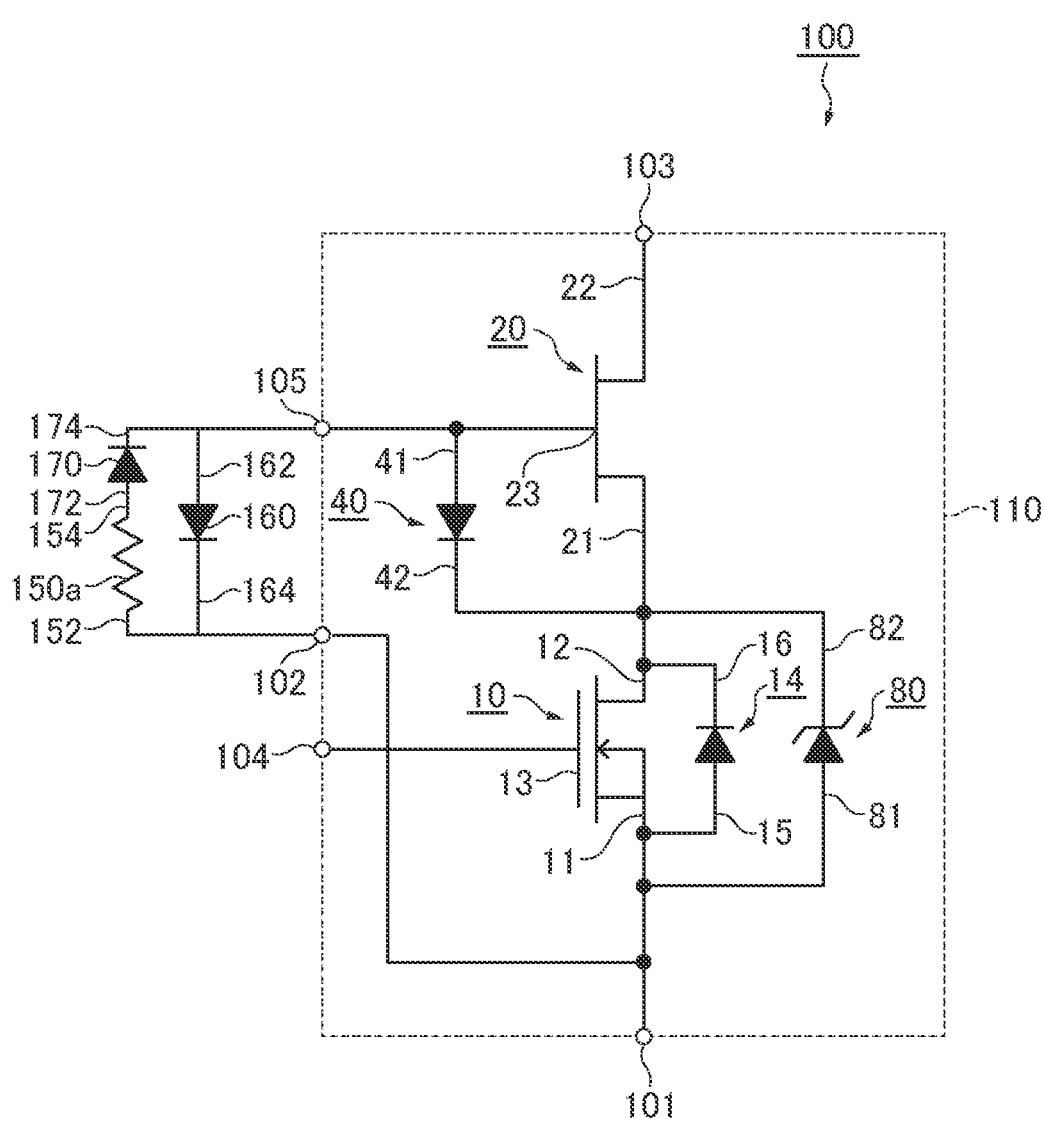
FIG. 10 is a circuit diagram showing a fifth usage aspect of the semiconductor device of the first embodiment.

FIG. 10 is a circuit diagram showing a fifth usage aspect of the semiconductor device 100 of the present embodiment. A third cathode 164 of a first chip diode 160 is electrically connected to the second terminal 102. A third anode 162 of the first chip diode 160 is electrically connected to the fifth terminal 105.

The sixth terminal 152 of the chip resistor 150a is electrically connected to the second terminal 102. A fourth cathode 174 of a second chip diode 170 is electrically connected to the fifth terminal 105. A fourth anode 172 of the second chip diode 170 and the seventh terminal 154 are electrically connected. Accordingly, an electric circuit in which the second chip diode 170 and the chip resistor 150a are electrically connected is electrically connected in parallel to the first chip diode 160.

When a large current suddenly flows from a side of the fifth terminal 105 to a side of the second terminal 102, the large current flows from the first chip diode 160. On the other hand, when a large current suddenly flows from the side of the second terminal 102 to the side of the fifth terminal 105, the large current flows from the second chip diode 170, but the current is limited by the chip resistor 150a. Accordingly, when the n-type normally-off transistor 10 and the normally-on transistor 20 provided in the semiconductor package 110 change from an off state to an on state, the flow of the sudden large current is suppressed, and a noise increase is suppressed.

Although the embodiment using the chip resistor 150a is described in FIG. 10, the chip ferrite beads 156 may be used instead of the chip resistor 150a.

Figure 11:
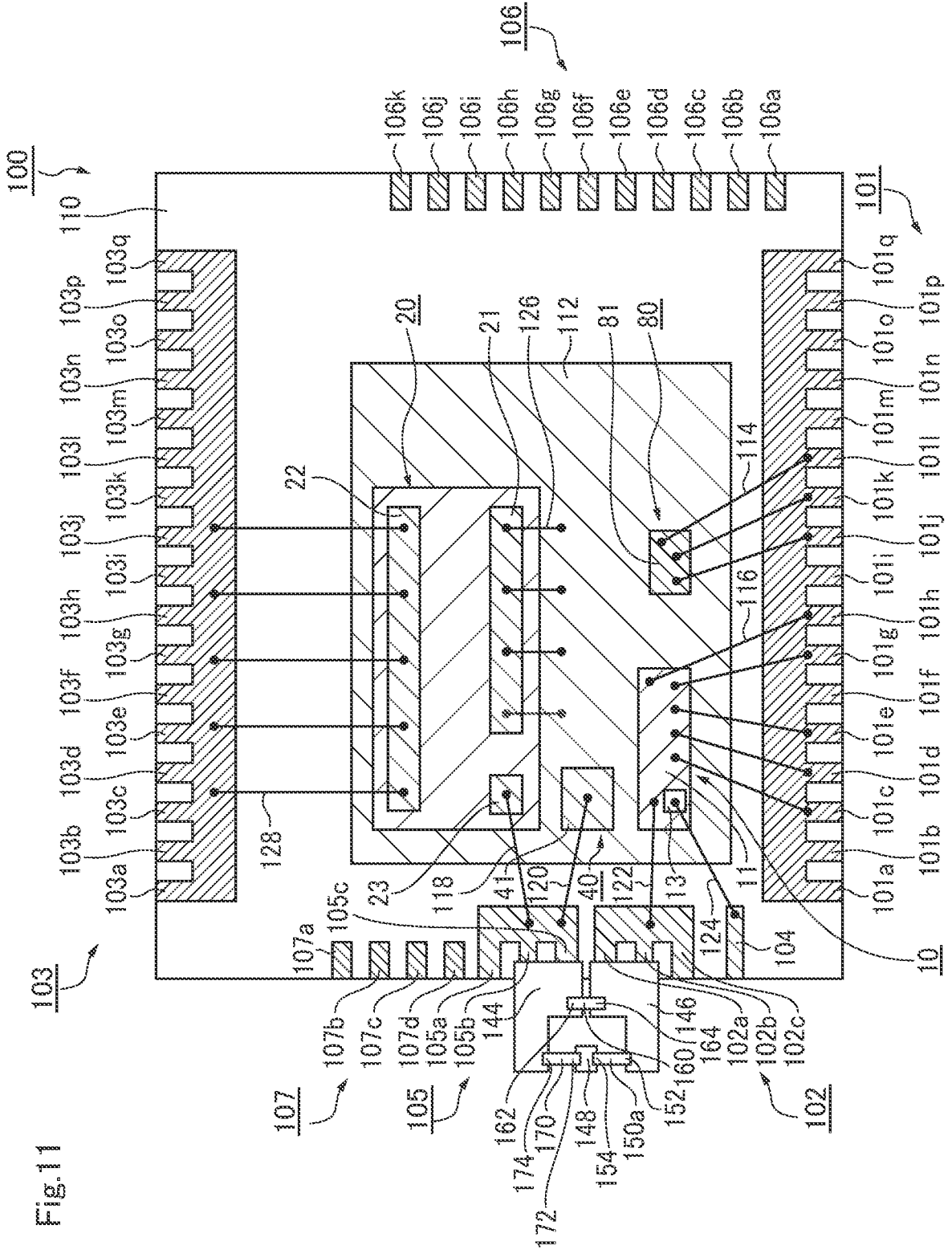
FIG. 11 is a schematic top view showing the fifth usage aspect of the semiconductor device of the first embodiment.

FIG. 11 is a schematic top view showing the fifth usage aspect of the semiconductor device 100 of the present embodiment. A metal plate 146 is electrically connected to the second terminal 102c. The sixth terminal 152 and the third cathode 164 are electrically connected to the metal plate 146. A metal plate 144 is electrically connected to the fifth terminal 105a. The third anode 162 and the fourth cathode 174 are electrically connected to the metal plate 144. The seventh terminal 154 and the fourth anode 172 are connected by a metal plate 148.

Figure 12:
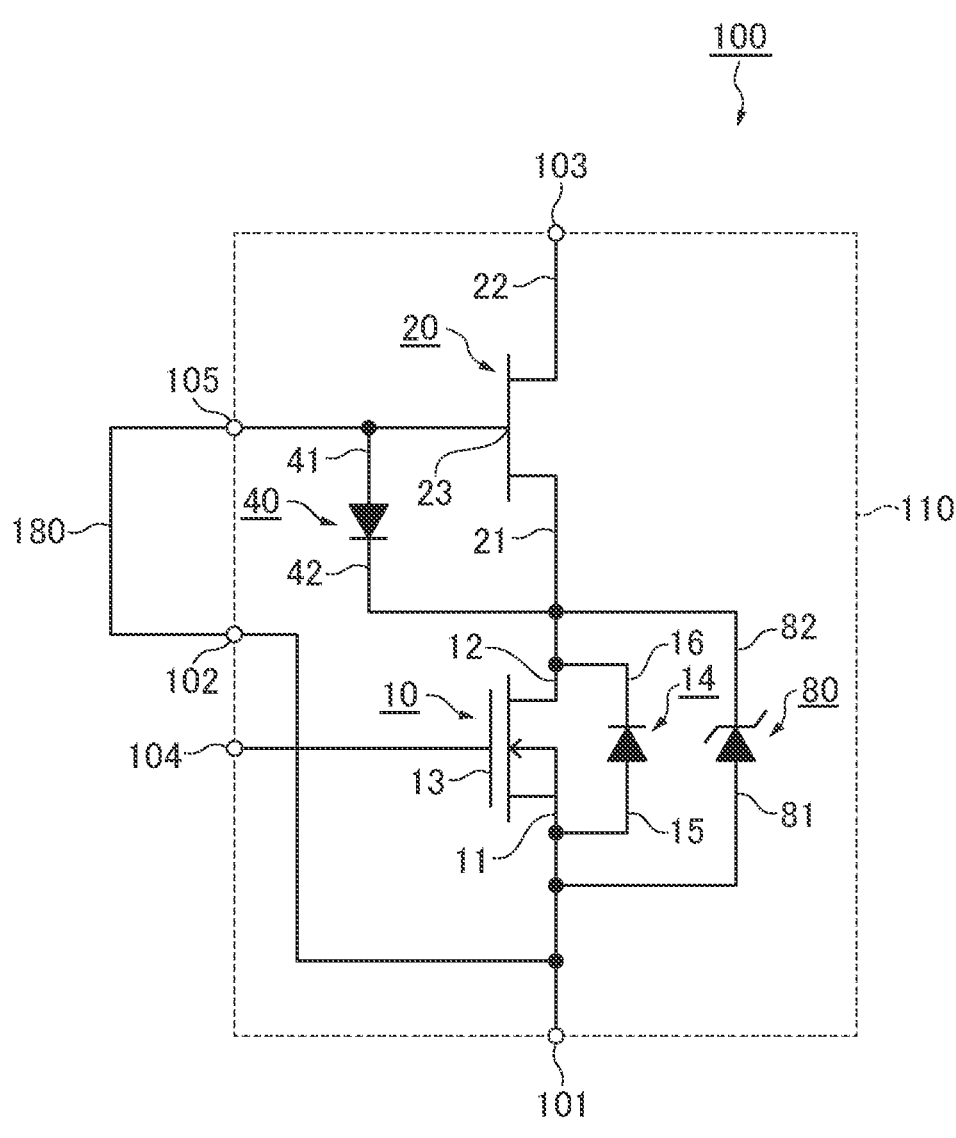
FIG. 12 is a circuit diagram showing a sixth usage aspect of the semiconductor device of the first embodiment.

FIG. 12 is a schematic top view showing a sixth usage aspect of the semiconductor device 100 of the present embodiment. The second terminal 102 and the fifth terminal 105 are electrically connected by a wiring 180. An aspect in which the terminals are connected by using the wiring 180 may be used as this usage aspect. The second terminal 102 may be any of the second terminals 102a, 102b, and 102c. The fifth terminal 105 may be any of the fifth terminals 105a, 105b, and 105c.

Figure 13:
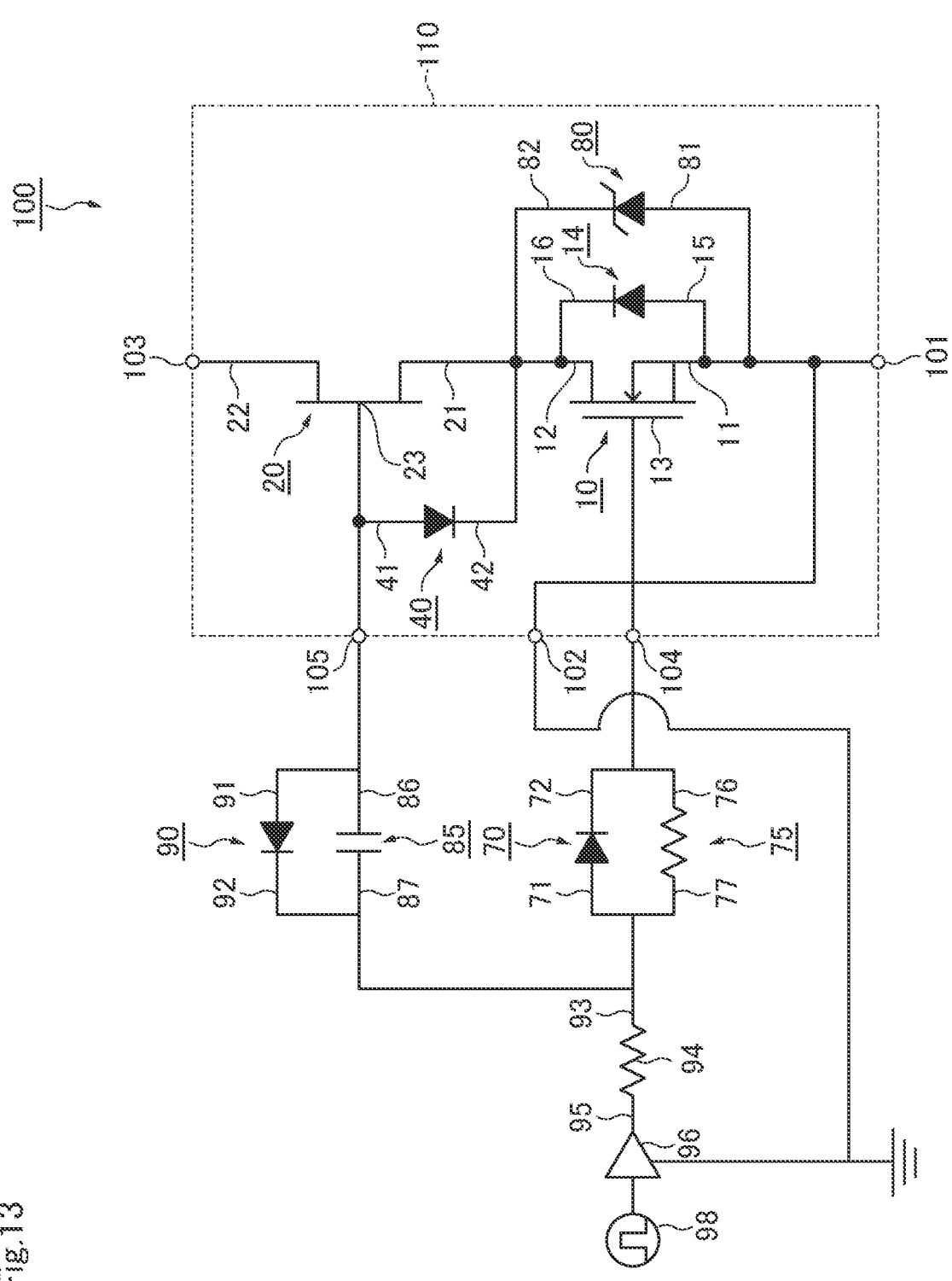
FIG. 13 is a circuit diagram showing a seventh usage aspect of the semiconductor device of the first embodiment.

FIG. 13 is a circuit diagram showing a seventh usage aspect of the semiconductor device 100 of the present embodiment.

A capacitor 85 includes an eighth terminal 86 and a ninth terminal 87. The eighth terminal 86 is electrically connected to the fifth terminal.

A resistor 75 includes a tenth terminal 76 and an eleventh terminal 77. The tenth terminal 76 is electrically connected to the fourth terminal 104.

A second diode 70 includes a fifth anode 71 and a fifth cathode 72. The fifth anode 71 is electrically connected to the eleventh terminal 77. The fifth cathode 72 is electrically connected to the fourth terminal 104 and the tenth terminal 76. The second diode 70 is provided electrically in parallel with the resistor 75.

A third diode 90 includes a third anode 91 and a third cathode 92. The third anode 91 is electrically connected to the fifth terminal 105 and the eighth terminal 86. The third cathode 92 is electrically connected to the ninth terminal 87, the fifth anode 71, and the eleventh terminal 77. The third diode 90 is provided electrically in parallel with the capacitor 85.

It is preferable that the second diode 70 and the third diode 90 are Schottky barrier diodes including a high response speed. The second diode 70 and the third diode 90 can be preferably used even though the diodes are PN junction diodes.

It is preferable that the capacitor 85 is a ceramic capacitor. This is because the ceramic capacitor includes excellent frequency characteristics. However, other film capacitors, aluminum electrolytic capacitors, tantalum electrolytic capacitors, and the like can also be preferably used as the capacitor 85.

A gate resistor 94 includes a terminal 93 and a terminal 95. The terminal 93 is connected to the third cathode 92, the ninth terminal 87, the fifth anode 71, and the eleventh terminal 77.

A signal source 98 outputs signals such as a square waves.

A gate drive circuit 96 is connected to the terminal 95. The gate drive circuit 96 outputs signals for driving the n-type normally-off transistor 10 and the normally-on transistor 20 based on the signal output from the signal source 98. A ground of the gate drive circuit 96 is connected to the second terminal 102.

The gate drive circuit 96 is an IC in which a plurality of elements is integrated into one chip, or an electronic circuit board on which a plurality of electronic components is mounted.

Next, an example of an operation of the seventh usage aspect of the semiconductor device 100 of the present embodiment will be described.

For example, a case where a square wave that reciprocates between 0 V and $V_{g\_on}$ is output by using the signal source 98 and the gate drive circuit 96 is considered.

Figure 14A:
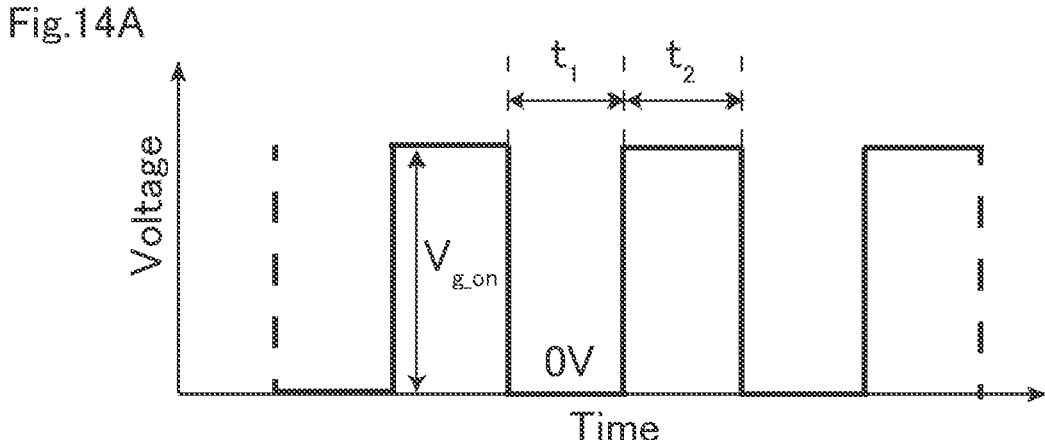
FIGS. 14A to 14C are schematic diagrams showing an example of $V_{g\_on}$.
Figure 14B:
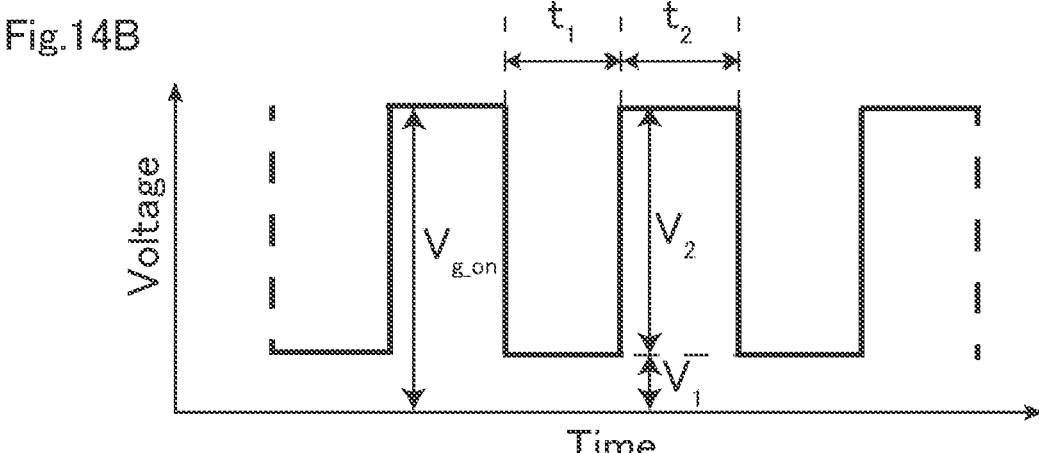
Figure 14C:
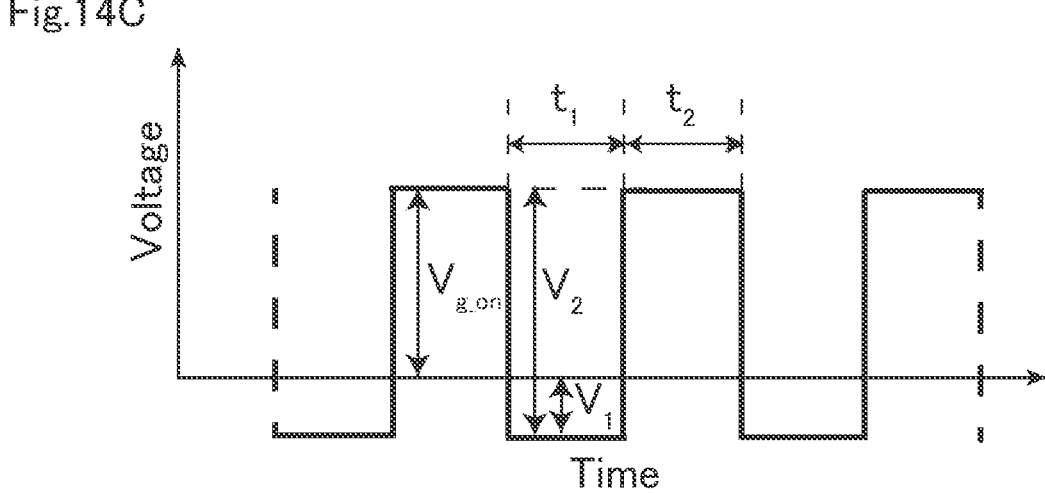

FIGS. 14A to 14C are schematic diagrams showing an example of $V_{g\_on}$. FIG. 14A shows a case where an output voltage of the gate drive circuit 96 is the square wave that reciprocates between 0 V output for time $t_1$ and $V_{g\_on}$ output for time $t_2$. FIG. 14B shows a case where an output voltage of a first gate drive circuit 96a is a square wave that reciprocates $V_1$ output for time $t_1$ and the sum of $V_1$ and $V_2$ output for time $t_2$. In the case of FIG. 14B, $V_{g\_on}=V_1+V_2$ ($V_{g\_on}=|V_1|+|V_2|$). FIG. 14C shows a case where a negative voltage is output for time $t_1$. In the case of FIG. 14C, $V_{g\_on}=|V_2|-|V_1|$. As described above, the output voltage of the gate drive circuit 96 is a voltage that changes with time. For example, a maximum voltage of the output voltage of the gate drive circuit 96 is $V_{g\_on}$. In FIGS. 14A to 14C, $t_1=t_2$ is shown, but $t_1$ and $t_2$ may be different. Further, the method of changing the output voltage of the gate drive circuit 96 with time is not limited to that shown in FIGS. 14A to 14C. $V_{g\_on}$ can be easily measured by using a commercially available oscilloscope or the like. $V_{g\_on}$ is a voltage measured with a voltage of the first terminal 101 or the first electrode 11 as a reference. Here, the expression "with a voltage as a reference" means, for example, "a voltage is set to 0 V".

When $V_{g\_on}$ is output from the gate drive circuit 96, a current flows from the capacitor 85 via the first diode 40. A voltage corresponding to a forward voltage $V_F$ of the first diode 40 is input between the second control electrode 23 and the third electrode 21. Accordingly, the normally-on transistor 20 is turned on. On the other hand, when 0 V is output from the gate drive circuit 96, a current flows to the capacitor 85 in a reverse direction via a parasitic capacitance $C_{gs}$ (not shown) of the normally-on transistor 20. A negative voltage ($V_F-V_{g\_on}$) corresponding to a difference between $V_F$ and $V_{g\_on}$ is input between the second control electrode 23 and the third electrode 21. When the negative voltage ($V_F-V_{g\_on}$) is smaller than a threshold voltage of the normally-on transistor 20, the normally-on transistor 20 can be turned off.

When $V_{g\_on}$ is larger than a threshold voltage of the n-type normally-off transistor 10, the n-type normally-off transistor 10 can be turned on when $V_{g\_on}$ is output from the gate drive circuit 96.

Here, it is desirable that the n-type normally-off transistor 10 is turned on earlier than the normally-on transistor 20 when the semiconductor device 100 changes from an off state to an on state. When the normally-on transistor 20 is turned on earlier, since a large voltage is applied to a connection portion between the second electrode 12 and the third electrode 21, there is a concern that characteristics of the n-type normally-off transistor 10 including a low withstand voltage deteriorate.

In the semiconductor device 100 of the present embodiment, when the semiconductor device 100 changes from the off state to the on state, the current output from the gate drive circuit 96 flows through the second diode 70. Thus, the charging of the first control electrode 13 is not affected by the resistor 75. Accordingly, the first control electrode 13 can be charged quickly. Thus, when the semiconductor device 100 changes from the off state to the on state, the n-type normally-off transistor 10 can be surely turned on earlier than the normally-on transistor 20. Therefore, the reliability of the semiconductor device can be improved.

The resistor 75 is provided, and thus, an off timing of the n-type normally-off transistor 10 can be delayed by a desired time from an off timing of the normally-on transistor 20. Due to the characteristics of the second diode 70, a resistance value of the resistor 75, and a design of a shape of the square wave, the semiconductor device can operate while maintaining a state of the n-type normally-off transistor 10 in the on state.

A case where 0 V is output by the signal source 98 and the gate drive circuit 96 and the n-type normally-off transistor 10 and the normally-on transistor 20 are turned off is considered. When a large voltage is applied to the fourth electrode 22, a voltage of the third electrode 21 becomes large. At this time, there is a concern that the off state of the normally-on transistor 20 is not maintained. Thus, the third diode 90 is provided, and the gate drive circuit 96 and the second control electrode 23 are short-circuited. Accordingly, the off state of the normally-on transistor 20 is maintained.

In the above description, the electrical connection via the metal plate 140, the metal plate 142, the metal plate 144, and the metal plate 146 is described. However, the electrical connection between the second terminal 102 and the fifth terminal 105 in the semiconductor device 100 of the embodiment may be an electrical connection without using the metal plate 140, the metal plate 142, the metal plate 144, and the metal plate 146.

Next, actions and effects of the semiconductor device 100 of the embodiment will be described.

Figure 15:
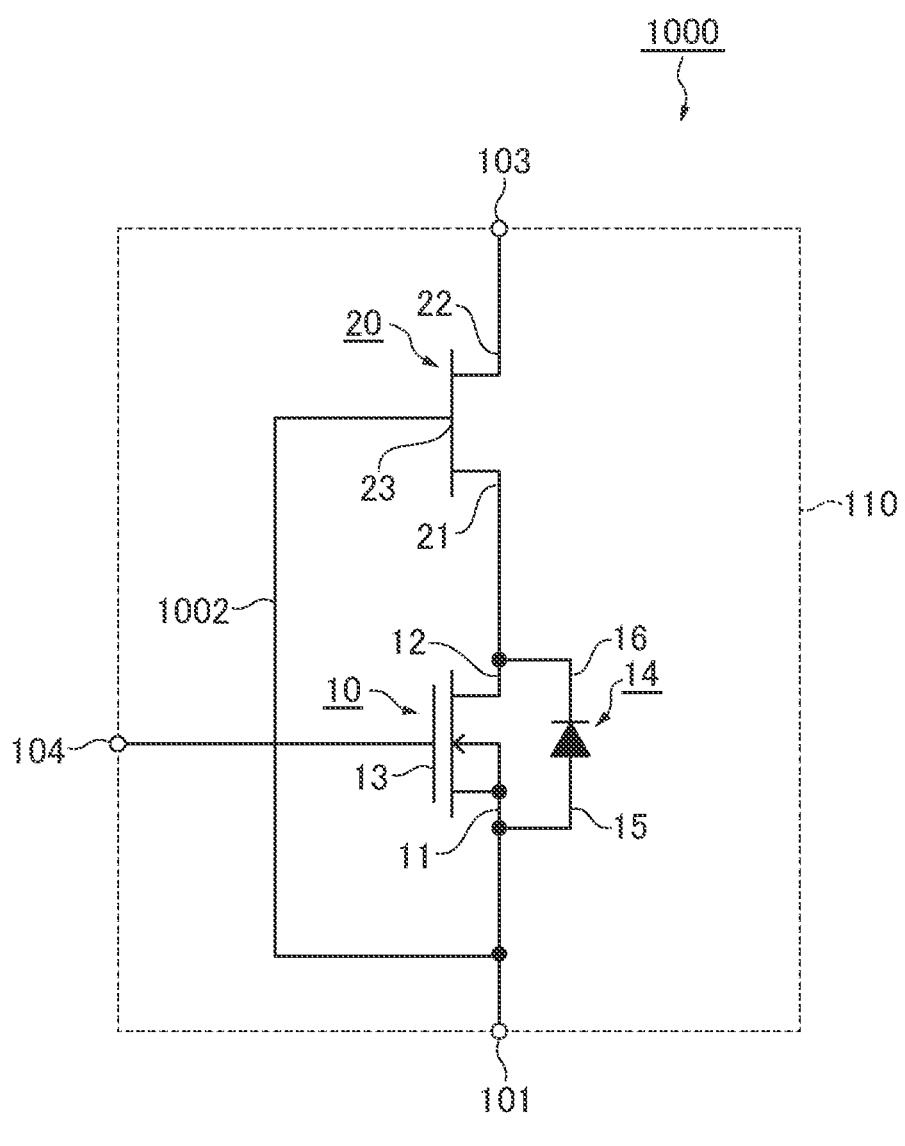
FIG. 15 is a circuit diagram of a semiconductor device according to a comparison form of the first embodiment.

FIG. 15 is a circuit diagram of a semiconductor device 1000 which is a comparison form of the embodiment. In the semiconductor device 1000, the second terminal 102, the fifth terminal 105, the first diode 40, and the Zener diode 80 are not provided. The second control electrode 23 and the first electrode 11 are electrically connected via a wiring 1002. For example, the signal source and the gate drive circuit are connected to the first control electrode 13 via the fourth terminal 104, and a signal for controlling the n-type normally-off transistor 10 is input. A voltage input to the second control electrode 23 is decided by a difference between a voltage of the second electrode 12 and a voltage of the first electrode 11, that is, an inter drain-source voltage Vds of the n-type normally-off transistor 10. Accordingly, both the n-type normally-off transistor 10 and the normally-on transistor 20 can be controlled.

Here, when dV/dt which is a temporal change in voltage due to switching occurs in an unintended form, suppression may be required. For example, a method of selecting a resistor including an appropriate resistance value and connecting the first electrode 11 and the second control electrode 23 with such a resistor is considered as a method of controlling dV/dt. However, the resistance value of the resistor connecting the first electrode 11 and the second control electrode 23 differs depending on the specifications of the power conversion system 900 in which the semiconductor device 1000 is used. Thus, when trial and error is not performed by actually using the semiconductor device 1000 in the power conversion system 900, it is difficult to appropriately select the resistance value of the resistor connecting the first electrode 11 and the second control electrode 23. However, since the first electrode 11 and the second control electrode 23 are connected in the semiconductor package 110, there is a problem that the selection of the resistor and the connection of the resistor cannot be easily performed.

Since a signal including a high frequency is generated in switching the power, it is preferable that the first electrode 11 and the second control electrode 23 are connected with a short wiring length. However, a size of the chip resistor or the chip ferrite bead preferably used as the resistor may have a different size depending on the resistance value of the resistor. Accordingly, the connection in which the wiring length differs greatly depending on the resistance value is performed, and thus, dV/dt cannot be controlled well. As a result, parasitic oscillation is caused.

For example, when the semiconductor device 100 is used in the seventh usage aspect, the reliability of the semiconductor device 100 is improved as described above. However, other usage aspects may be appropriately used in some specifications of the power conversion system 900. Thus, there is a demand for a semiconductor device easily available in various usage aspects.

Accordingly, in the semiconductor device 100 of the embodiment, since the plurality of second terminals 102 and the plurality of fifth terminals 105 through which the virtual straight line $l_1$ passes are provided, in other words, the plurality of second terminals 102 and the plurality of fifth terminals 105 lined up in the first direction are provided, the plurality of second terminals 102 and the plurality of fifth terminals 105 are appropriately selected depending on the specifications of the power conversion system 900 and the sizes of the chip resistor and the chip ferrite bead to be used in any of the first usage aspect shown in FIGS. 4 and 5, the second usage aspect shown in FIG. 6, the third usage aspect shown in FIG. 7, the fourth usage aspects shown in FIGS. 8 and 9, and the fifth usage aspect shown in FIGS. 10 and 11, and thus, the resistor or the like can be connected with a short wiring length. thus, dV/dt can be easily controlled.

In some specifications of the power conversion system 900, the semiconductor device 100 can be used in the sixth usage aspect shown in FIG. 12. In the sixth usage aspect, it can be seen that the connection between the second control electrode 23 and the first electrode 11 using the wiring 1002 of the semiconductor device 1000 which is the comparison form is performed by using the wiring 180 outside the semiconductor package 110.

In some specifications of the power conversion system 900, the semiconductor device 100 can be used in the seventh usage aspect shown in FIG. 13.

As described above, the semiconductor device 100 can be appropriately used depending on the specifications of the power conversion system 900. Thus, the semiconductor device applicable to various usage aspects can be provided.

Figures 16A, 16B, 16C:
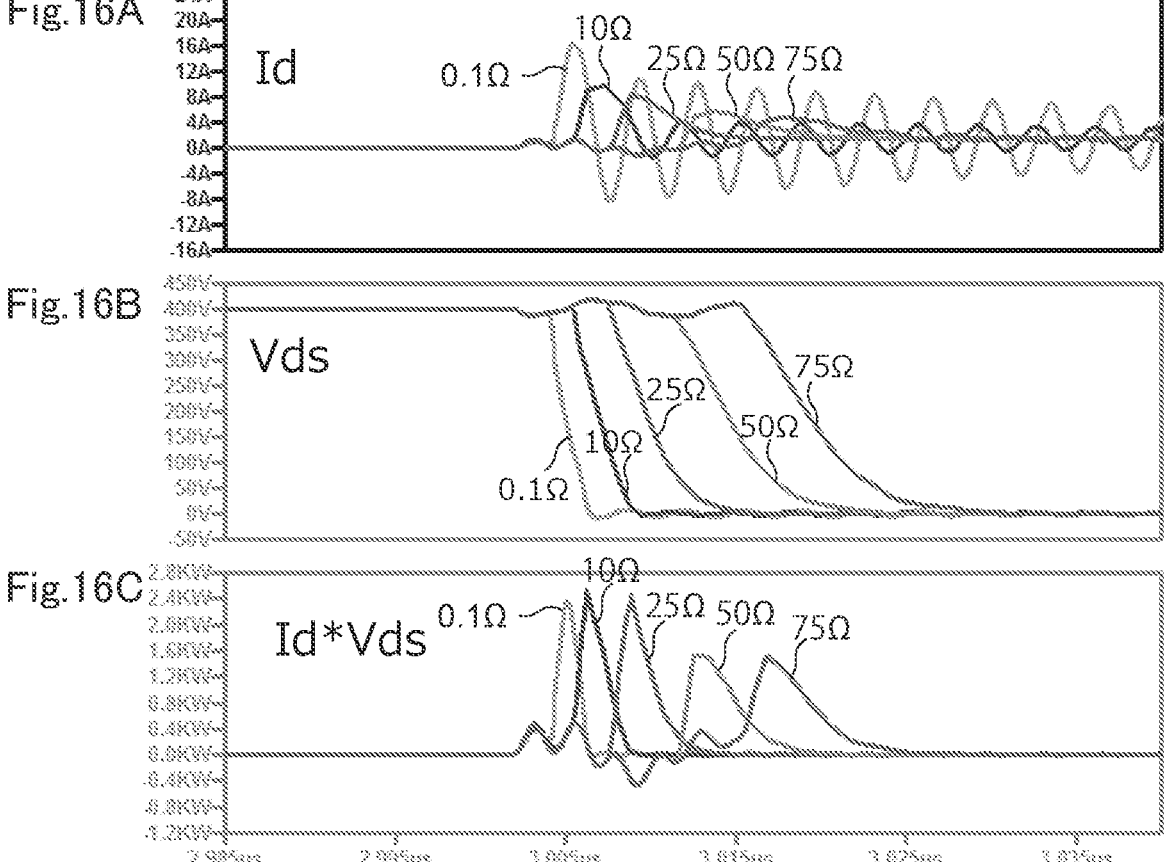
FIGS. 16A to 16C are graphs for describing actions and effects of the first embodiment.

FIGS. 16A to 16C are graphs for describing the actions and effects of the semiconductor device 100 of the embodiment. FIG. 16A is a graph showing a temporal change of the current flowing through the n-type normally-off transistor 10 and the normally-on transistor 20 when the resistance value of the chip resistor 150 is changed in a case where the semiconductor device 100 of the embodiment is used in the first usage aspect. FIG. 16B is a graph showing a temporal change of the voltage between the first electrode 11 and the fourth electrode 22 when the resistance value of the chip resistor 150 is changed in a case where the semiconductor device 100 of the embodiment is used in the first usage aspect. FIG. 16C is a graph showing a temporal change of a product of the current flowing through the n-type normally-off transistor 10 and the normally-on transistor 20 and the voltage between the first electrode 11 and the fourth electrode 22 when the resistance value of the chip resistor 150 is changed in a case where the semiconductor device 100 of the embodiment is used in the first usage aspect. As shown in FIG. 16A, when the resistance value of the chip resistor 150 is small, the oscillation of the current does not easily attenuate even after a long time elapses, and an amplitude of the vibration is also large. When the resistance value of the chip resistor 150 is large, the oscillation of the current attenuates after a short time elapses, and the amplitude of the oscillation is also small. As shown in FIG. 16B, when the resistance value of the chip resistor 150 is large, there is a tendency for the voltage to decrease from 400 V to 0 V for a longer time. When the resistance value of the chip resistor 150 is small, there is a tendency for the voltage to decrease from 400 V to 0 V for a shorter time, and dV/dt can be easily controlled. As shown in FIG. 16C, as the resistance value of the chip resistor 150 becomes large, there is a tendency for the above-mentioned product of the current and voltage to decrease. In the semiconductor device 100 of the embodiment, an operation in each preferred aspect can be performed by appropriately selecting the resistance value of the chip resistor 150 depending on the specifications of the power conversion system 900.

It is preferable that the plurality of second terminals 102 and the plurality of fifth terminals 105 are provided at the end portion of the semiconductor package 110. It is preferable that neither the first terminal 101, the third terminal 103, nor the fourth terminal 104 is provided between the plurality of second terminals 102 and the plurality of fifth terminals

105. By doing this, the connection of the chip resistor 150 and the like can be minimized.

It is preferable that the fourth terminal 104 is provided at the end portion of the semiconductor package 110. It is preferable that neither the first terminal 101, the third terminal 103, nor the fifth terminal 105 is provided between the plurality of second terminals 102a, 102b, and 102c and the fourth terminal 104. By doing this, a parasitic inductance generated in the wiring can be reduced.

It is preferable that the fifth terminal 105 is provided at the end portion of the semiconductor package 110. It is preferable that neither the first terminal 101, the third terminal 103, nor the fourth terminal 104 is provided between the plurality of second terminals 102a, 102b, and 102c and the fifth terminal 105. By doing this, a parasitic inductance generated in the wiring can be reduced.

According to the semiconductor device 100 of the present embodiment, the semiconductor device applicable to various usage aspects can be provided.

Second Embodiment

A semiconductor device of the present embodiment includes a semiconductor package including an n-type normally-off transistor including a first electrode, a second electrode, and a first control electrode, a normally-on transistor including a third electrode electrically connected to the second electrode, a fourth electrode, and a second control electrode, a first diode including a first anode electrically connected to the second control electrode and a first cathode electrically connected to the first electrode, and a Zener diode including a second anode electrically connected to the first electrode and a second cathode electrically connected to the second electrode; a first terminal provided on the semiconductor package, the first terminal being electrically connected to the first electrode; a plurality of second terminals provided on the semiconductor package, the second terminals being electrically connected to the first electrode, and the second terminals being lined up in a first direction; a third terminal provided on the semiconductor package, the third terminal being electrically connected to the fourth electrode; a fourth terminal provided on the semiconductor package, the fourth terminal being electrically connected to the first control electrode; and a plurality of fifth terminals provided on the semiconductor package, the fifth terminals being electrically connected to the second control electrode, and the fifth terminals being lined up in the first direction. Here, the description of the contents overlapping with the first embodiment will be omitted.

Figure 17:
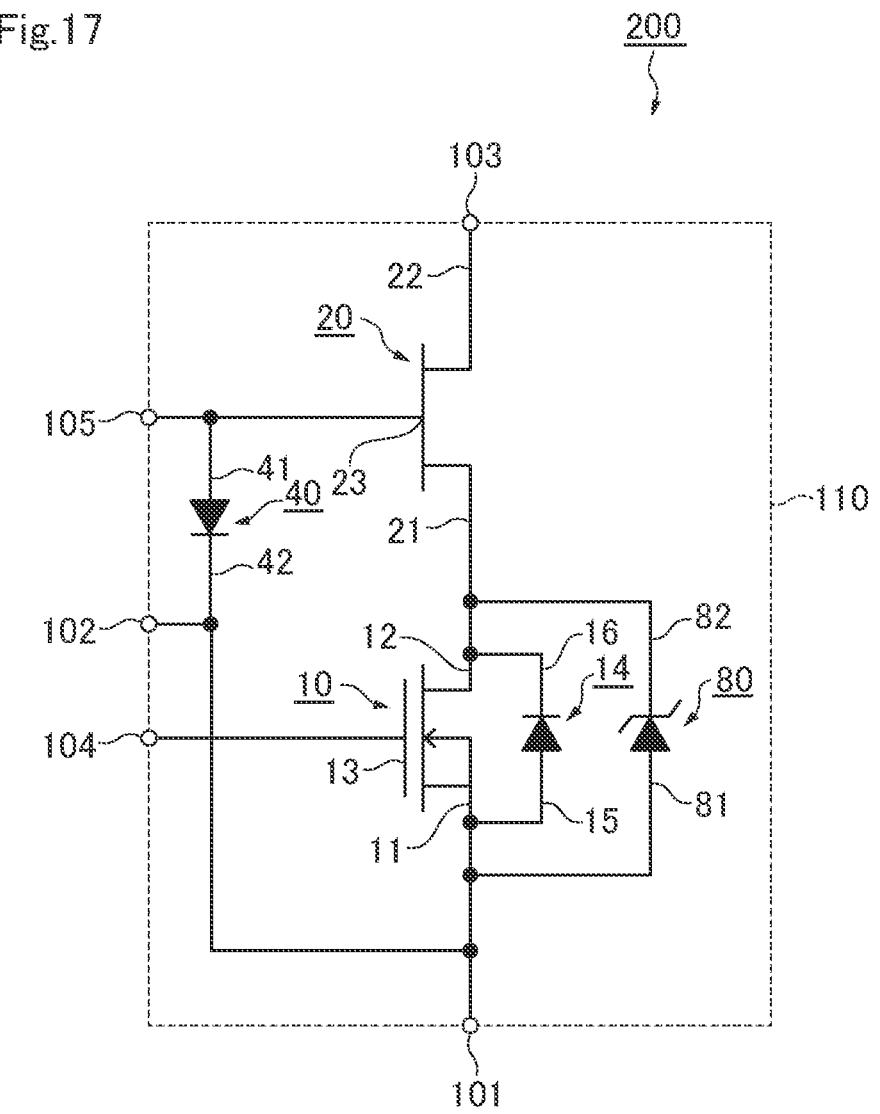
FIG. 17 is a circuit diagram of a semiconductor device of a second embodiment.

FIG. 17 is a circuit diagram of a semiconductor device 200 of the present embodiment. The semiconductor device 200 differs from the semiconductor device 100 of the first embodiment in that the first cathode 42 of the first diode 40 is electrically connected to the first electrode 11. Since the plurality of second terminals 102 is electrically connected to the first electrode 11, the first cathode 42 is electrically connected to the plurality of second terminals 102.

In the semiconductor device 200 of the present embodiment, the semiconductor device applicable to various usage aspects can also be provided.

Third Embodiment

A semiconductor device of the present embodiment includes a semiconductor package including a p-type channel normally-off transistor (hereinafter, referred to as the p-type normally-on transistor) including a first electrode, a second electrode, and a first control electrode, a normally-on transistor including a third electrode electrically connected to the second electrode, a fourth electrode, and a second control electrode; at least one first terminal provided on the semiconductor package, the at least one first terminal being electrically connected to the first electrode; a second terminal provided on the semiconductor package, the second terminal being electrically connected to the second electrode or the third electrode, and the second terminal being lined up in a first direction; at least one third terminal provided in the semiconductor package, the at least one the third terminal being electrically connected to the fourth electrode; a fourth terminal provided on the semiconductor package, the fourth terminal being electrically connected to the first control electrode, and the fourth terminal being lined up in the first direction; and a fifth terminal provided on the semiconductor package, the fifth terminal being electrically connected to the second control electrode, and the fifth terminal being lined up in the first direction. Here, the description of the contents overlapping with the first and second embodiments will be omitted.

Figure 18:
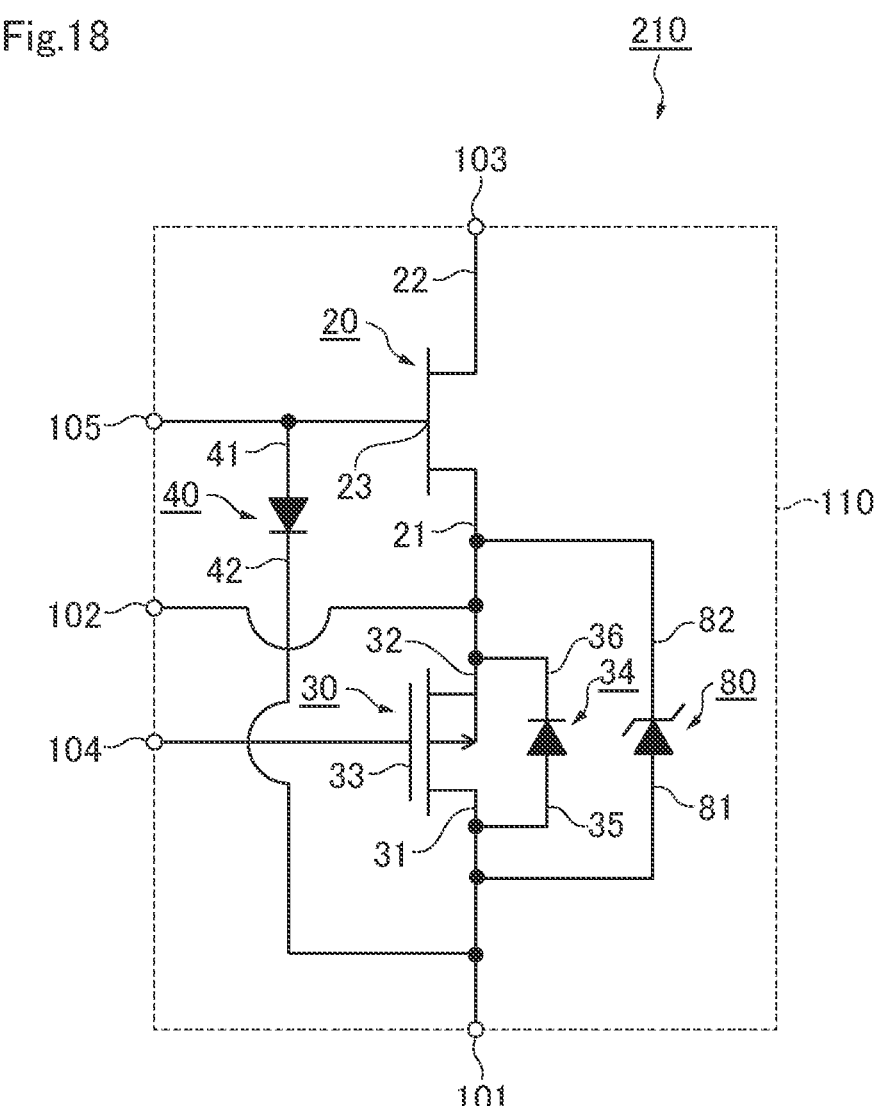
FIG. 18 is a circuit diagram of a semiconductor device of a third embodiment.

FIG. 18 is a circuit diagram of a semiconductor device 210 of the present embodiment. In the semiconductor device 210, a p-type normally-off transistor 30 is used instead of the n-type normally-off transistor 10. The p-type normally-off transistor 30 includes a first electrode 31, a second electrode 32, and a first control electrode 33. The p-type normally-off transistor 30 is a transistor through which a drain current does not flow when a voltage is not input to a gate. The p-type normally-off transistor 30 is, for example, a p-type channel metal oxide semiconductor field effect transistor (MOSFET) using a silicon (Si) semiconductor. For example, the first electrode 31 is a drain electrode, the second electrode 32 is a source electrode, and the first control electrode 33 is a gate electrode. The p-type normally-off transistor 30 includes a body diode (parasitic diode) 34 including an anode 35 and a cathode 36. A withstand voltage of the p-type normally-off transistor 30 is, for example, 10 V or more and 50 V or less.

The semiconductor device of the present embodiment differs from the semiconductor device 100 of the first embodiment in which the second terminal 102 is electrically connected to the second electrode 32 (or the third electrode 21). Although the control is performed by the voltage between the first electrode 11 as the source electrode and the first control electrode 13 in the case of the n-type normally-off transistor, since control is performed by the voltage between the second electrode 32 as the source electrode and the first control electrode 33 in the case of the p-type normally-off transistor, the second terminal 102 is electrically connected to the second electrode 32.

Figure 19:
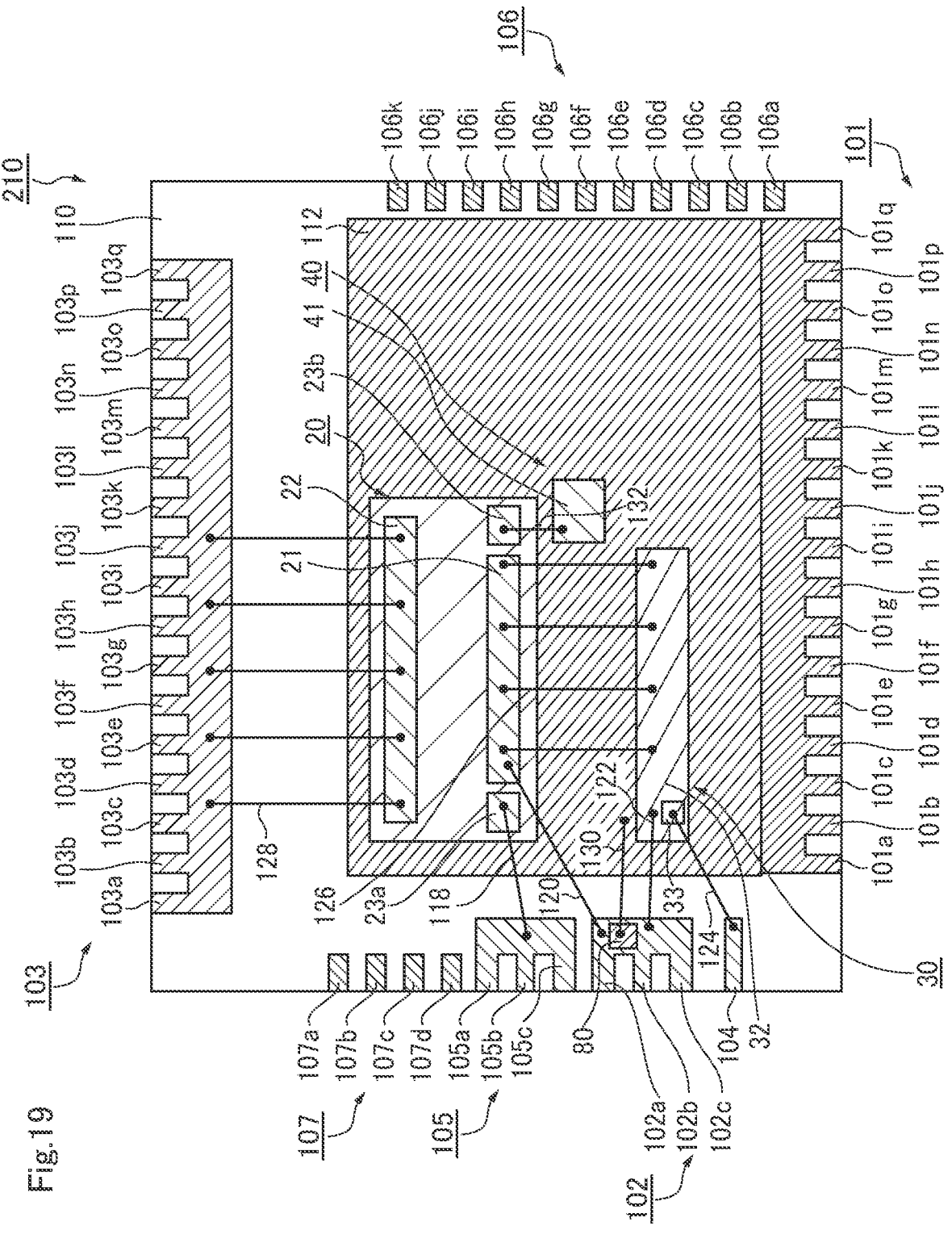
FIG. 19 is a schematic top view of the semiconductor device of the third embodiment.

FIG. 19 is a schematic top view of the semiconductor device 210 of the present embodiment.

For example, the metal plate 112 plated with nickel, palladium, gold, or the like on copper (Cu) is electrically connected to the first terminal 101. The normally-on transistor 20, the p-type normally-off transistor 30, and the first diode 40 are provided on the plate 112.

The normally-on transistor 20 includes a second control electrode 23a and a second control electrode 23b as the second control electrode 23. The second control electrode 23a is electrically connected to the fifth terminal 105 by, for example, the bonding wire 118. The third electrode 21 is electrically connected to the second terminal 102 by, for example, the bonding wire 120.

The p-type normally-off transistor 30 includes the second electrode 32 and the first control electrode 33 on an upper surface, and the first electrode 31 (not shown) on a lower surface. The second electrode 32 is electrically connected to the third electrode 21 by, for example, the bonding wire 126. The first control electrode 33 is electrically connected to the fourth terminal 104 by, for example, the bonding wire 124. The first electrode 31 is electrically connected to the plate 112 and the first terminal 101.

The Zener diode 80 is provided on the second terminal 102. The second anode 81 of the Zener diode 80 is provided on the upper surface of the Zener diode 80, and is electrically connected to the plate 112 and the first terminal 101 by, for example, a bonding wire 130. The second cathode 82 of the Zener diode 80 is provided on the lower surface of the Zener diode 80 and is electrically connected to the second terminal 102 and the second electrode 32.

The first anode 41 of the first diode 40 is provided on the upper surface of the first diode 40. The second control electrode 23b is electrically connected to the first anode 41 by, for example, a bonding wire 132. The first cathode 42 of the first diode 40 (not shown in FIG. 19) is provided on the lower surface of the first diode 40 and is electrically connected to the plate 112 and the first terminal 101.

In the semiconductor device 210 using the p-type normally-off transistor 30, the second terminal 102 and the second electrode 32 are electrically connected. On the other hand, when the n-type normally-off transistor 10 is used, the plurality of second terminals 102 and the first electrode 11 are electrically connected. Thus, when the p-type normally-off transistor 30 is used, the Kelvin connection can be performed at a location closer to the third terminal 103 without passing through the normally-off transistor. Accordingly, the modulation, delay, ringing, and the like of the drive current can be further suppressed.

As stated above, the upper and lower terminals (first terminal 101 and third terminal 103 provided opposite each other) of the semiconductor package 110 serve as the drain terminal and the source terminal of the semiconductor device 210, and the horizontal terminals (second terminal 102, fourth terminal 104, and fifth terminal 105) serve as control terminals (gate terminal and Kelvin source terminal). Accordingly, since a high-side element package and a low-side element package can be provided so as to be close to each other in forming a half-bridge circuit or a full-bridge circuit, a wiring on a PCB board can be shortened. Accordingly, a parasitic inductance of a main loop (between the source and the drain of the normally-off transistor and between the source and the drain of the normally-on transistor) can be reduced.

The first diode 40 and the Zener diode 80 may not be provided.

In the semiconductor device of the present embodiment, the semiconductor device applicable to various usage aspects can also be provided.

Fourth Embodiment

The semiconductor device of the present embodiment differs from the semiconductor devices of the first to third embodiments in that the third terminal 103 and the first terminal 101 are not separated. Here, the description of the contents overlapping with the first to third embodiments will be omitted.

FIG. 20 is a schematic top view of a semiconductor device 220 of the present embodiment. The third terminal 103 is integrated and does not include separated portions like the third terminals 103a, 103b, 103c, . . . , and 103q. That is, the semiconductor device 220 includes the at least one third terminal 103. The same can be applied to the second terminal 102, the fifth terminal 105, the first terminal 101, the terminal 106, and the terminal 107.

In the semiconductor device of the present embodiment, the semiconductor device applicable to various usage aspects can also be provided.

Fifth Embodiment

The semiconductor device of the present embodiment differs from the semiconductor devices of the first to fourth embodiments in that the electrical connection is performed by using a metal plate instead of the bonding wire. Here, the description of the contents overlapping with the first to fourth embodiments will be omitted.

FIG. 21 is a schematic top view of a semiconductor device 230 of the present embodiment. A metal plate 129 is used instead of the bonding wire 128, and a metal plate 127 is used instead of the bonding wire 126. The metal plate 127 and the metal plate 129 are made of a metal such as copper (Cu) or aluminum (Al). Similarly, metal plates can be used for other bonding wires.

In the semiconductor device of the present embodiment, the semiconductor device applicable to various usage aspects can also be provided.

Sixth Embodiment

The semiconductor device of the present embodiment differs from the semiconductor device of the third embodiment in that the first diode 40 and the Zener diode 80 are not provided in the semiconductor package 110 (the first diode 40 and the Zener diode 80 are provided outside the semiconductor package 110). Here, the description of the contents overlapping with the first to fifth embodiments will be omitted.

Figure 22:
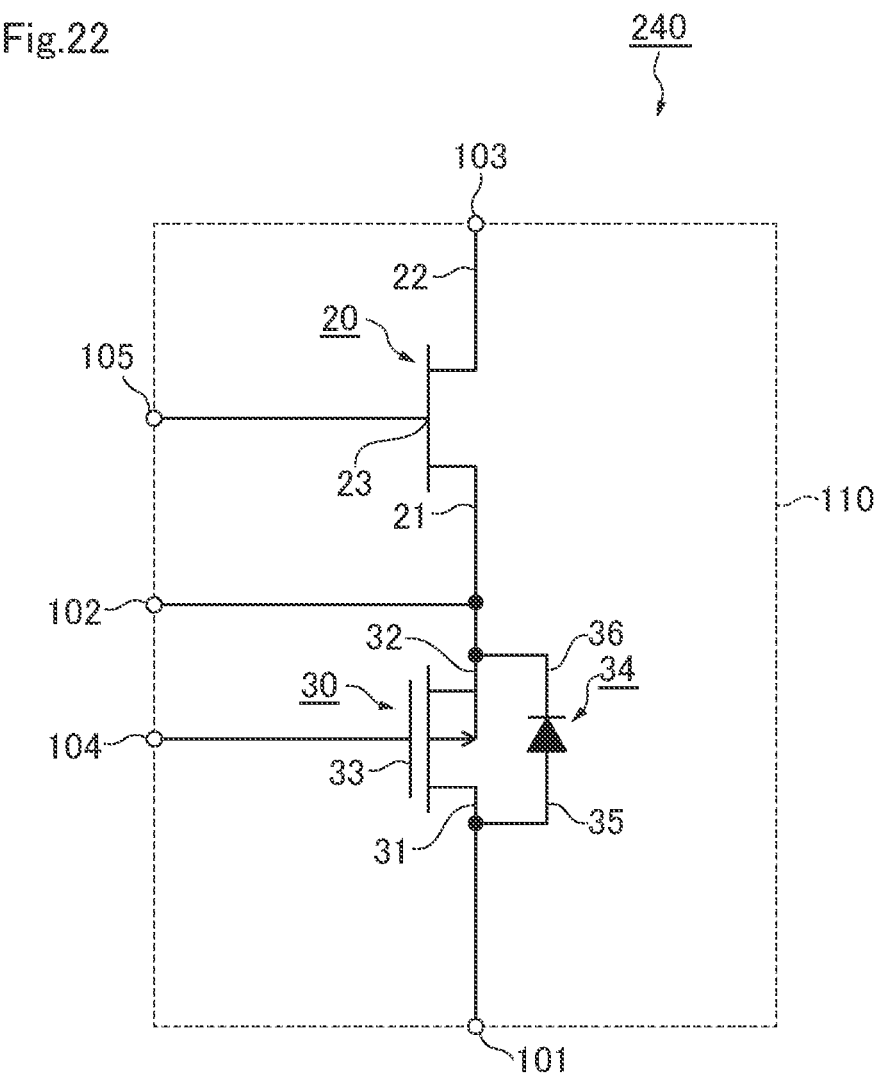
FIG. 22 is a circuit diagram of a semiconductor device of a sixth embodiment.
Figure 23:
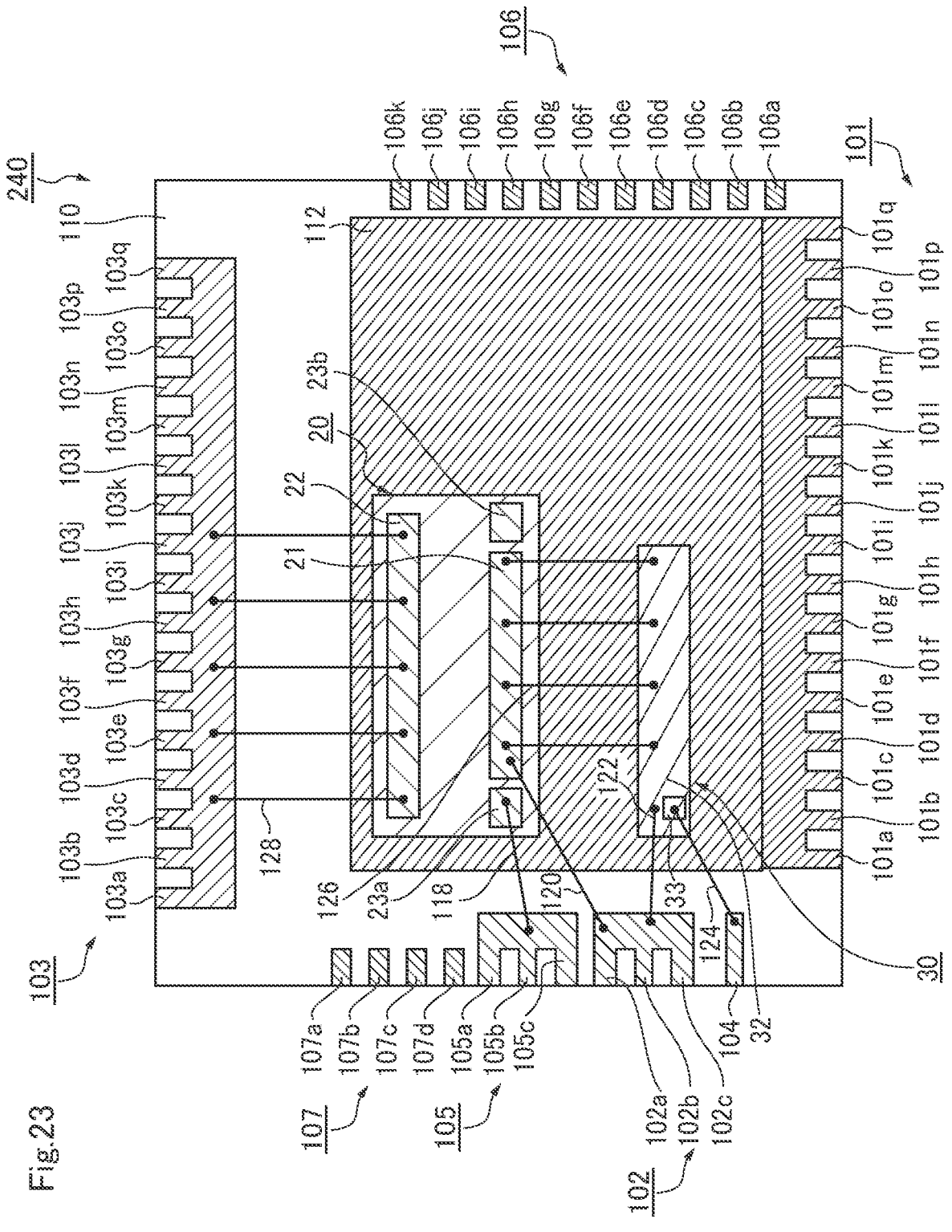
FIG. 23 is a schematic top view of the semiconductor device of the sixth embodiment.

FIG. 22 is a circuit diagram of a semiconductor device 240 of the present embodiment. FIG. 23 is a schematic top view of the semiconductor device 240 of the present embodiment. The first diode 40 and the Zener diode 80 are not provided in the semiconductor package 110, and thus, there is an advantage that a degree of freedom in designing the semiconductor device increases.

In the semiconductor device of the present embodiment, the semiconductor device applicable to various usage aspects can also be provided.

APPENDIX

Each of the above embodiments is summarized as follows.

Appendix 1

A semiconductor device comprising:
a semiconductor package including
    an n-type channel normally-off transistor including a first electrode, a second electrode, and
a first control electrode,
    a normally-on transistor including a third electrode electrically connected to the second electrode, a fourth electrode, and a second control electrode,
    a first diode including a first anode electrically connected to the second control electrode and a first cathode electrically connected to the third electrode, and a Zener diode including a second anode electrically connected to the first electrode and a second cathode electrically connected to the second electrode;

a first terminal provided on the semiconductor package, the first terminal being electrically connected to the first electrode;

a plurality of second terminals provided on the semiconductor package, the second terminals being electrically connected to the first electrode, and the second terminals being lined up in a first direction;

a third terminal provided on the semiconductor package, the third terminal being electrically connected to the fourth electrode;

a plurality of fourth terminals provided on the semiconductor package, the fourth terminals being electrically connected to the first control electrode; and a plurality of fifth terminals provided on the semiconductor package, the fifth terminals being electrically connected to the second control electrode, and the fifth terminals being lined up in the first direction.

Appendix 2

The semiconductor device according to appendix 1, in which a sixth terminal of a chip resistor or a chip ferrite bead including the sixth terminal and a seventh terminal is electrically connected to any one of the second terminals, and the seventh terminal is electrically connected to any one of the fifth terminals.

Appendix 3

The semiconductor device according to appendix 1, in which a third cathode of a first chip diode including a third anode and the third cathode is electrically connected to any one of the second terminals, the third anode is electrically connected to any one of the fifth terminals, a sixth terminal of a chip resistor or a chip ferrite bead including the sixth terminal and a seventh terminal is electrically connected to any one of the second terminals, a fourth cathode of a second chip diode including a fourth anode and the fourth cathode is electrically connected to any one of the fifth terminals, and the seventh terminal and the fourth cathode are electrically connected.

Appendix 4

The semiconductor device according to appendix 1, in which any one of the second terminals and any one of the fifth terminals are electrically connected by a wiring.

Appendix 5

The semiconductor device according to appendix 1, in which an eighth terminal of a capacitor including the eighth terminal and a ninth terminal is electrically connected to the fifth terminal.

Appendix 6

The semiconductor device according to appendix 5, in which a tenth terminal of a resistor including the tenth terminal and an eleventh terminal is connected to the fourth terminal, the eleventh terminal is electrically to the ninth terminal, a fifth anode of a second diode including the fifth anode and a fifth cathode is electrically to the eleventh terminal, the fifth cathode is electrically connected to the tenth terminal, and the second diode is electrically connected in parallel with the resistor.

Appendix 7

The semiconductor device according to any one of appendixes 1 to 6, in which the second terminals and the fifth terminals are provided at an end portion of the semiconductor package.

Appendix 8

The semiconductor device according to any one of appendixes 1 to 7, in which the first terminal, the third terminal, and the fourth terminal are not provided between the second terminals and the fifth terminals.

Appendix 9

The semiconductor device according to any one of appendixes 1 to 7, in which the second terminals are adjacent to the fifth terminals without passing through the first terminal, the third terminal, and the fourth terminal.

Appendix 10

The semiconductor device according to any one of appendixes 1 to 7, in which the first terminal, the third terminal, and the fifth terminal are not provided between the second terminals and the fourth terminals.

Appendix 11

The semiconductor device according to any one of appendixes 1 to 7, in which the second terminals are adjacent to the fourth terminals without passing through the first terminal, the third terminal, and the fifth terminal.

While certain embodiments have been described, these embodiments have been presented by way of example only, and are not intended to limit the scope of the inventions. Indeed, semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:

a semiconductor package including a normally-off transistor, and a normally-on transistor;

a fourth terminal provided on the semiconductor package, the fourth terminal being electrically connected to the normally-off transistor; and a fifth terminal provided on the semiconductor package, the fifth terminal being electrically connected to the normally-on transistor, wherein a Kelvin connection is performed to the semiconductor device, wherein parasitic oscillation is suppressed, and wherein a temporal change in voltage due to switching occurred in an unintended form is controlled.

2. The semiconductor device according to claim 1, further comprising:

a chip resistor or a chip ferrite bead electrically connected to the fifth terminal.

3. The semiconductor device according to claim 1, further comprising:

a first chip diode electrically connected to the fifth terminal;

a second chip diode electrically connected to the fifth terminal; and a chip resistor or a chip ferrite bead electrically connected to the second chip diode.

4. The semiconductor device according to claim 1, wherein a wiring is electrically connected to the fifth terminal.

5. The semiconductor device according to claim 1, wherein a capacitor is electrically connected to the fifth terminal.

6. The semiconductor device according to claim 5, wherein a resistor is connected to the fourth terminal and the capacitor, and wherein a second diode is electrically connected to the fourth terminal.

7. The semiconductor device according to claim 1, further comprising:

a first diode electrically connected to the normally-on transistor.

8. The semiconductor device according to claim 7, wherein the semiconductor package further includes the first diode.

9. The semiconductor device according to claim 7, wherein the semiconductor device comprises the first diode outside the semiconductor package.

10. The semiconductor device according to claim 1, further comprising:

a Zener diode electrically connected to the normally-off transistor or the normally-on transistor.

\* \* \* \* \*